United States Patent
Choi et al.

(10) Patent No.: US 6,483,749 B1
(45) Date of Patent: Nov. 19, 2002

(54) NONVOLATILE MEMORY DEVICE HAVING BULK BIAS CONTACT STRUCTURE IN CELL ARRAY REGION

(75) Inventors: Jeong-hyuk Choi, Suwon (KR); Yong-ju Choi, Seoul (KR); Kyung-joong Joo, Yongin (KR); Keon-soo Kim, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/650,493

(22) Filed: Aug. 29, 2000

(30) Foreign Application Priority Data

Aug. 30, 1999 (KR) .............................................. 99-36330

(51) Int. Cl.⁷ .............................................. G11C 16/04
(52) U.S. Cl. .............................. 365/185.18; 365/185.27
(58) Field of Search ........................ 365/185.18, 185.27, 365/185.2

(56) References Cited

U.S. PATENT DOCUMENTS

| | | | |
|---|---|---|---|
| 5,120,671 A | | 6/1992 | Tang et al. |
| 5,470,773 A | | 11/1995 | Liu et al. |
| 5,894,145 A | * | 4/1999 | Chen ............................ 257/296 |
| 6,002,610 A | * | 12/1999 | Cong ...................... 365/185.05 |
| 6,160,737 A | * | 12/2000 | Hsu ........................ 365/185.24 |

\* cited by examiner

Primary Examiner—A. Zarabian
(74) Attorney, Agent, or Firm—Marger Johnson & McCollom, PC

(57) ABSTRACT

A non-volatile memory device including a cell array region formed having a plurality of parallel bit lines, a plurality of parallel word lines, a plurality of memory cells, and a plurality of common source lines, the plurality of bit lines being orthogonal to the plurality of word lines, each of the memory cells being connected to a bit line and a word line and having a stacked gate comprised of a floating gate and a control gate and a source/drain region, the plurality of common source lines being parallel to the plurality of bit lines. The non-volatile memory device also includes a peripheral circuit region for driving the memory cells in the cell array region is formed. The cell array region includes one or more bulk bias contact structures for maintaining the voltage of a bulk region in which the cell array region is formed, at or below a predetermined voltage. The non-volatile memory device can uniformly maintain the voltage of a bulk region regardless of the position of memory cells without increasing the area of a cell array.

21 Claims, 40 Drawing Sheets

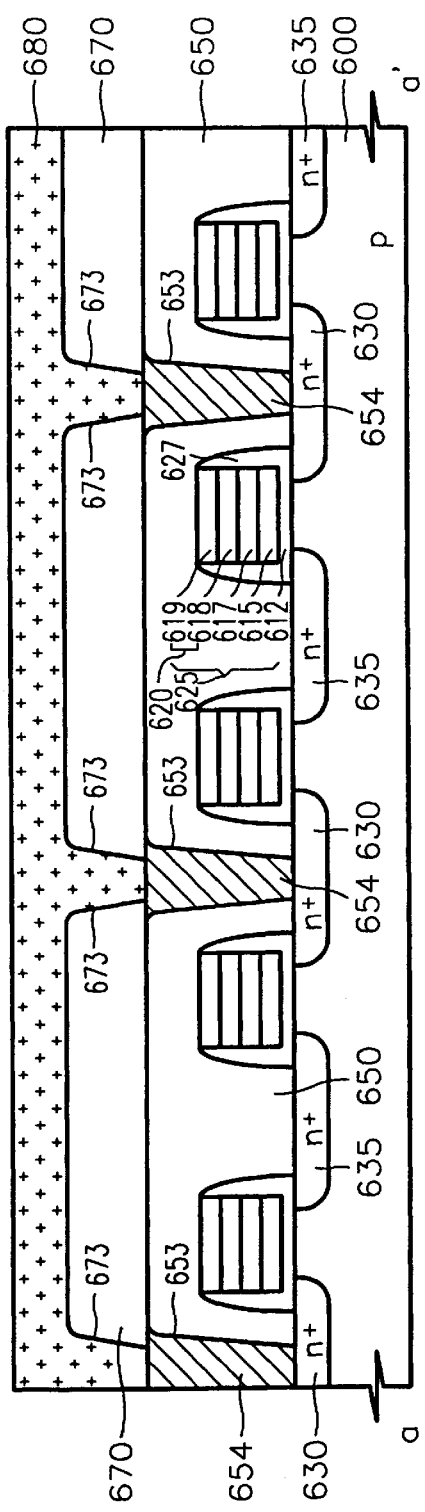
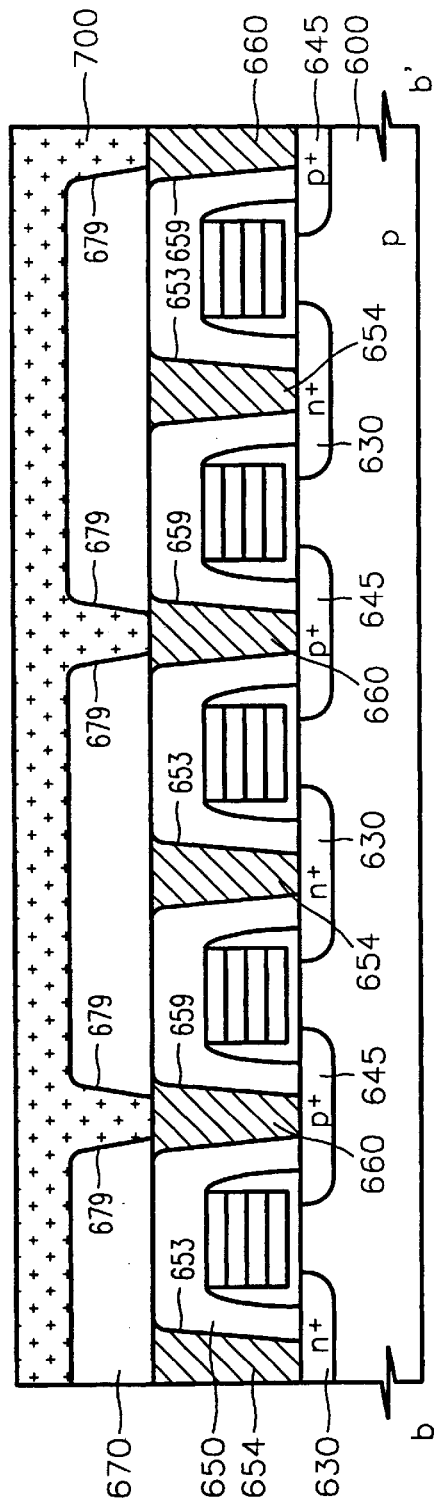

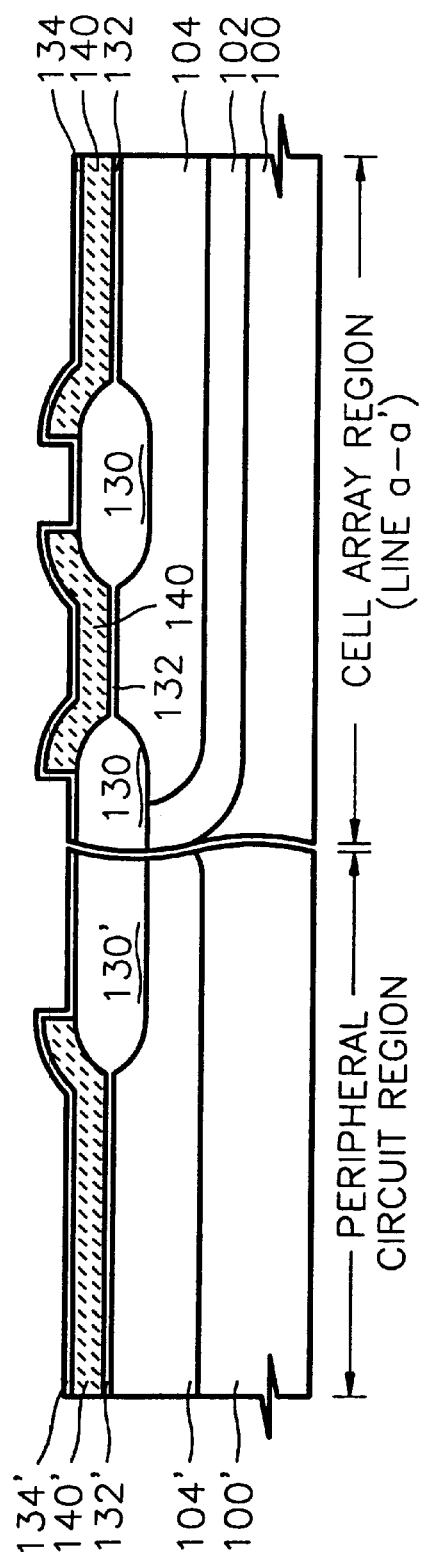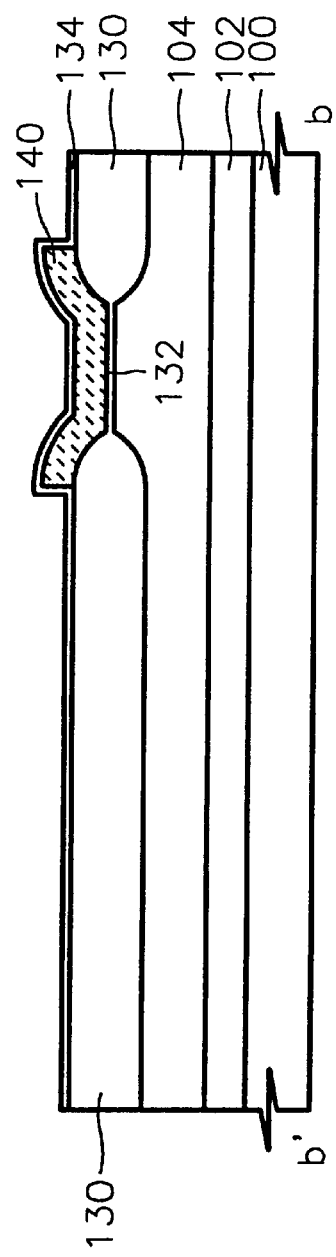

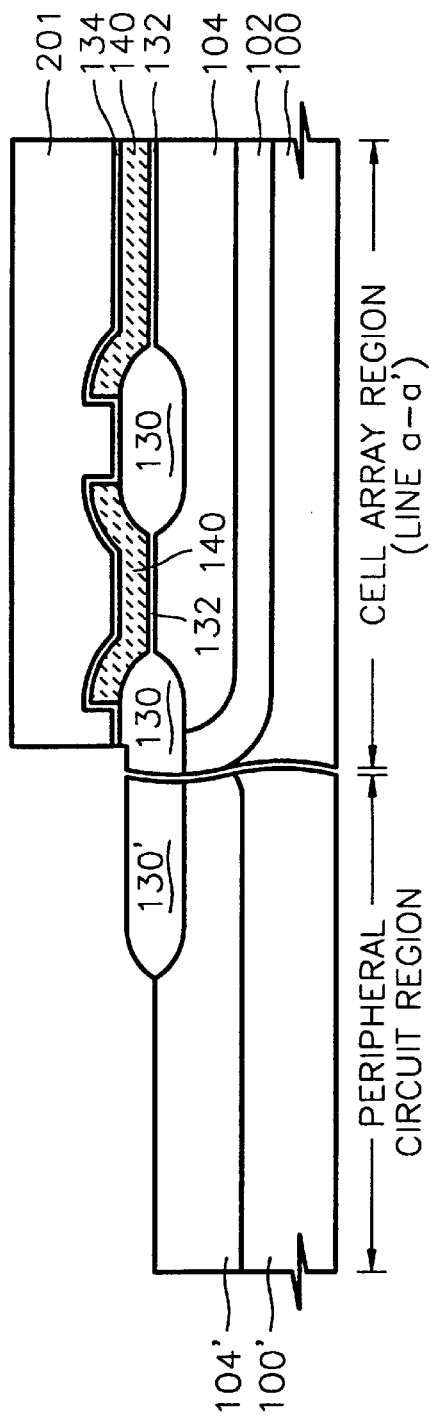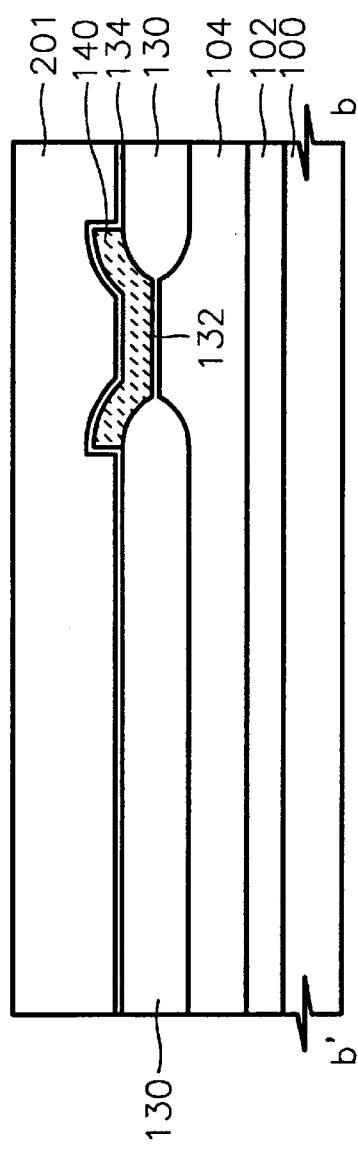

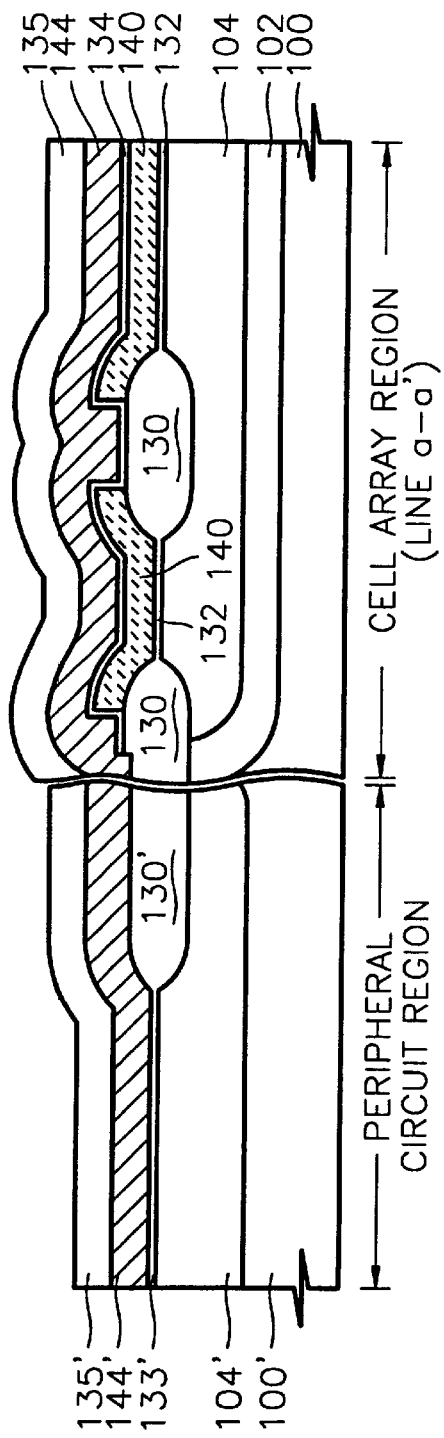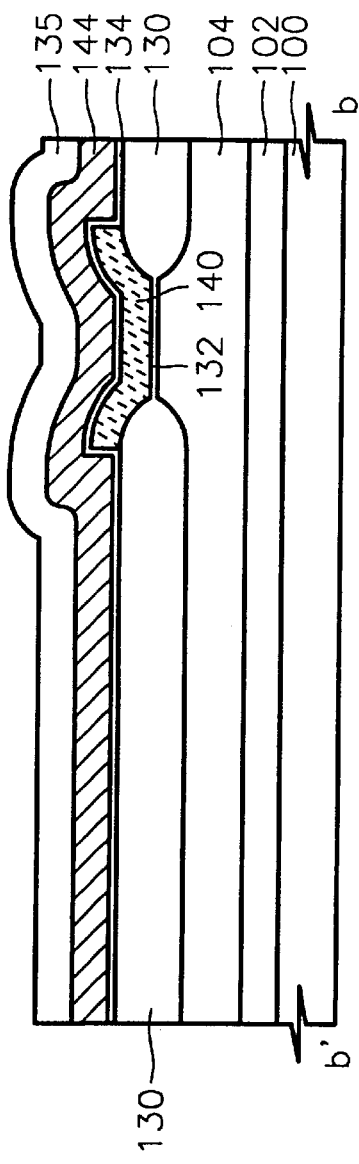
FIG. 23A
FIG. 23B

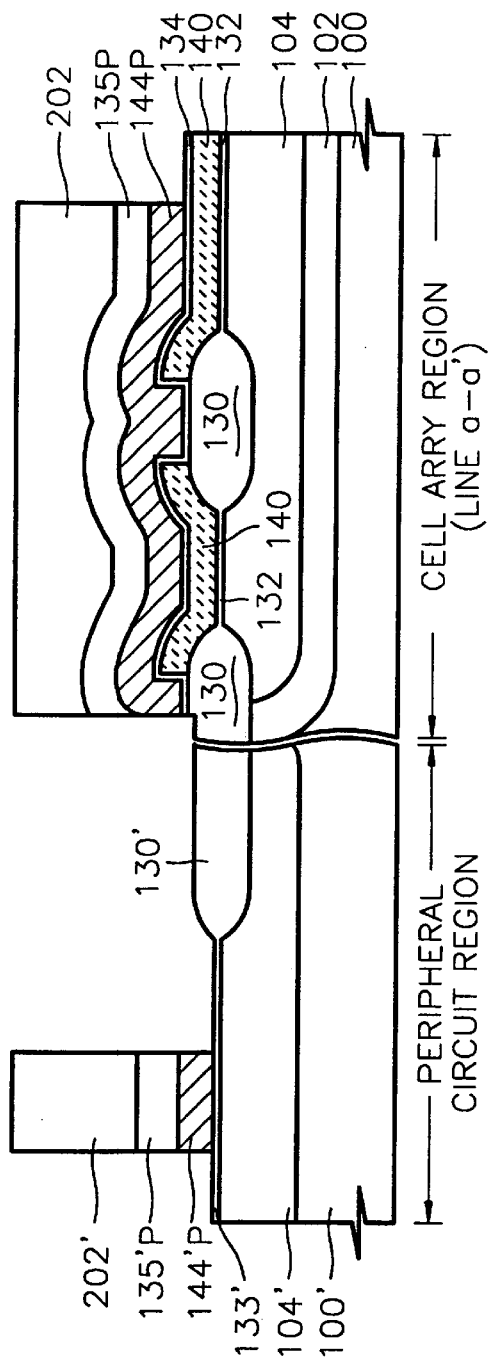
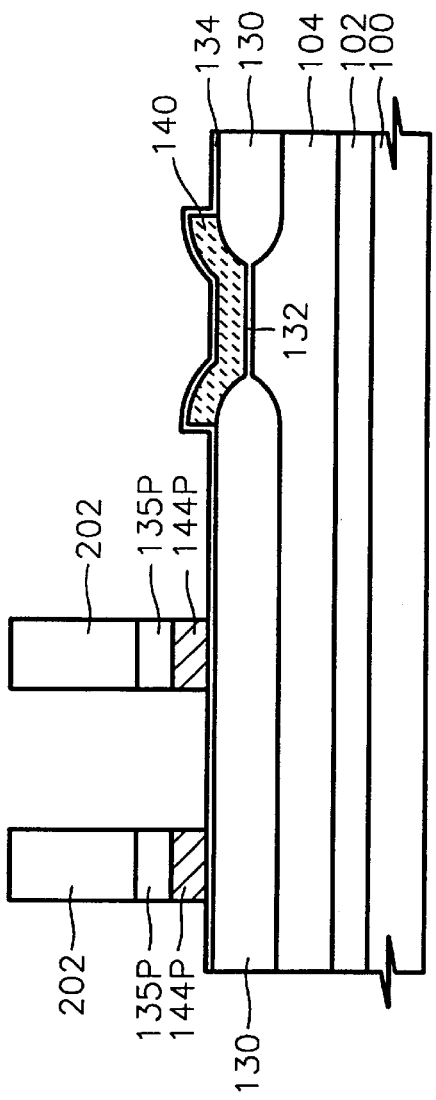

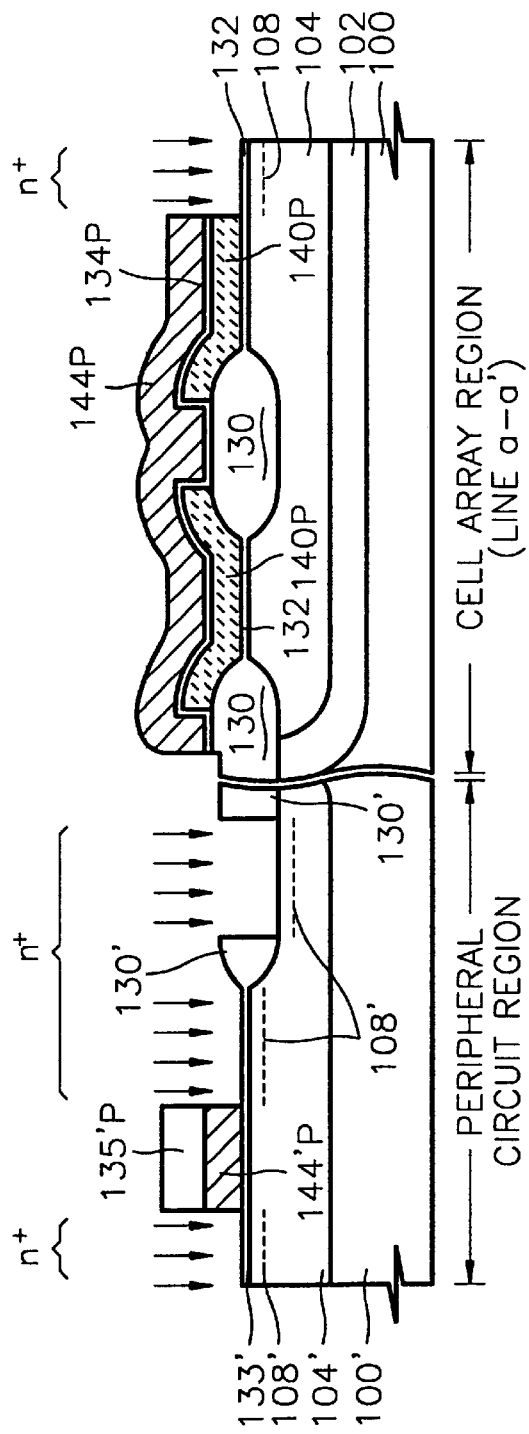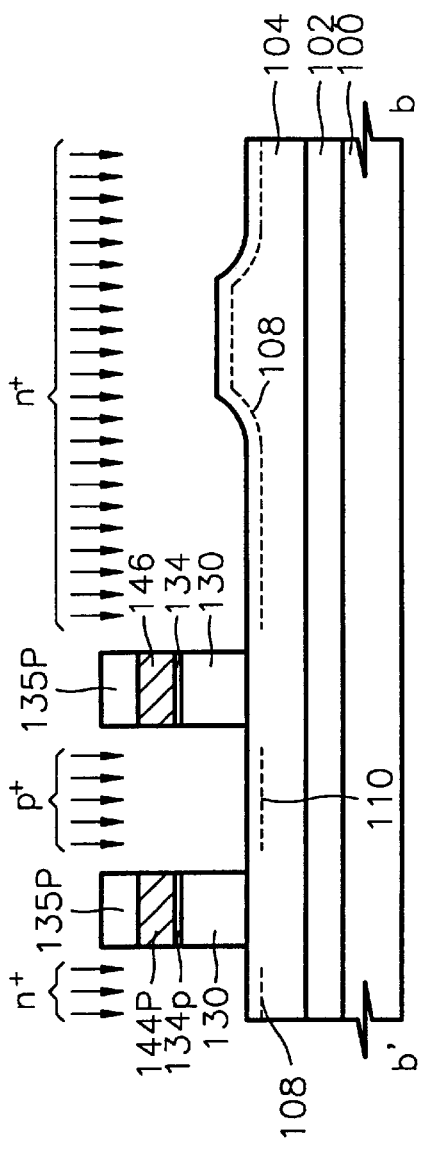

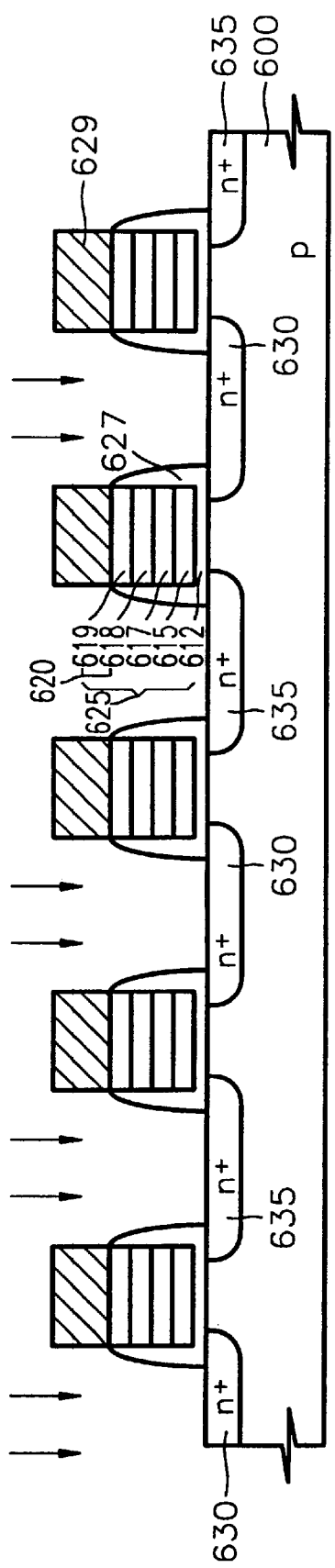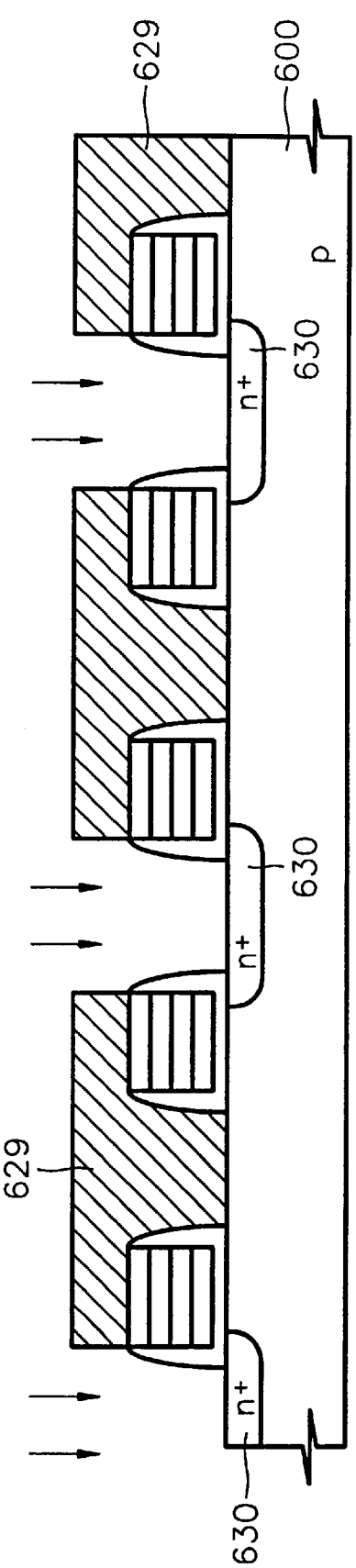

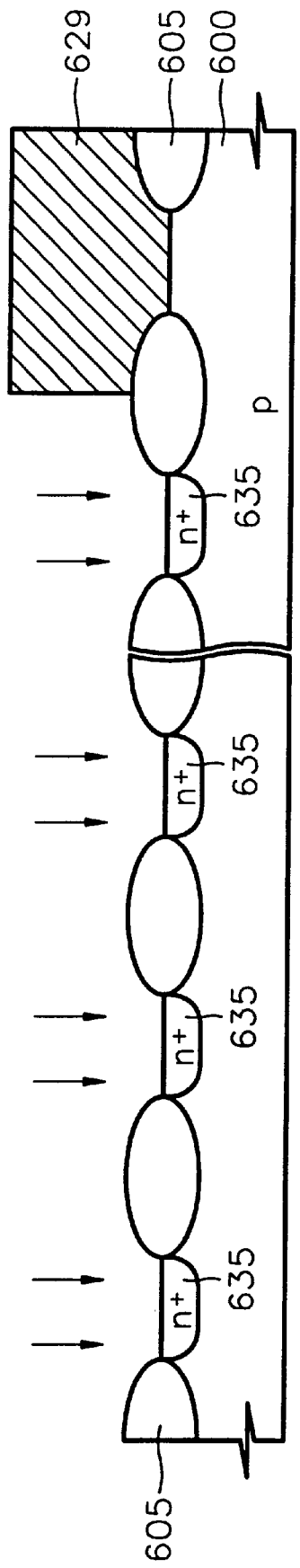
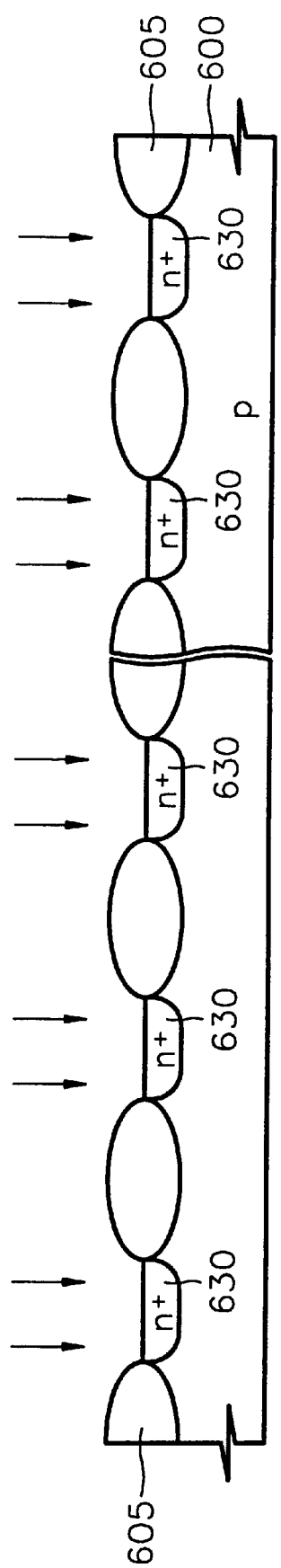
FIG. 29C
FIG. 29D

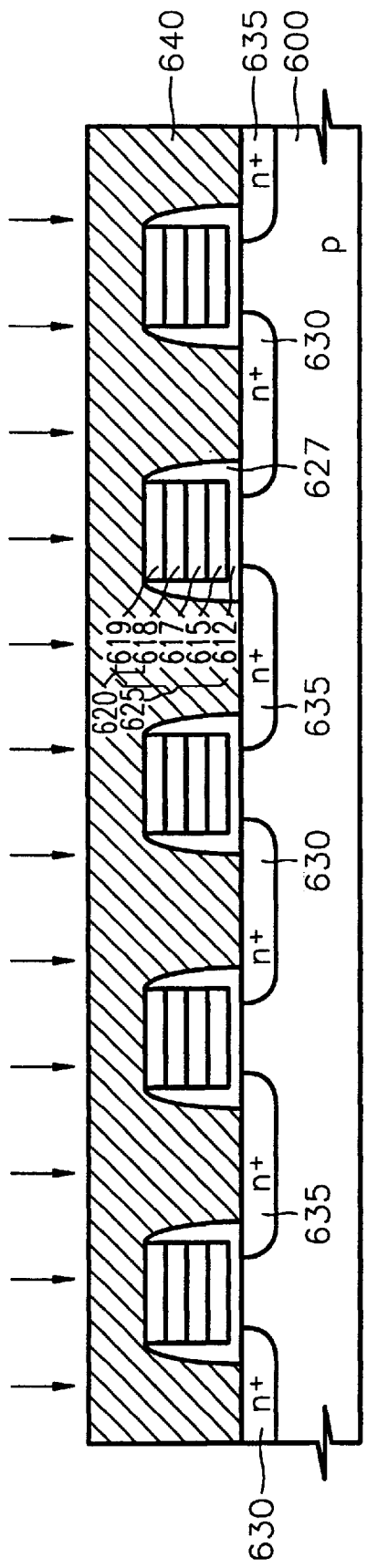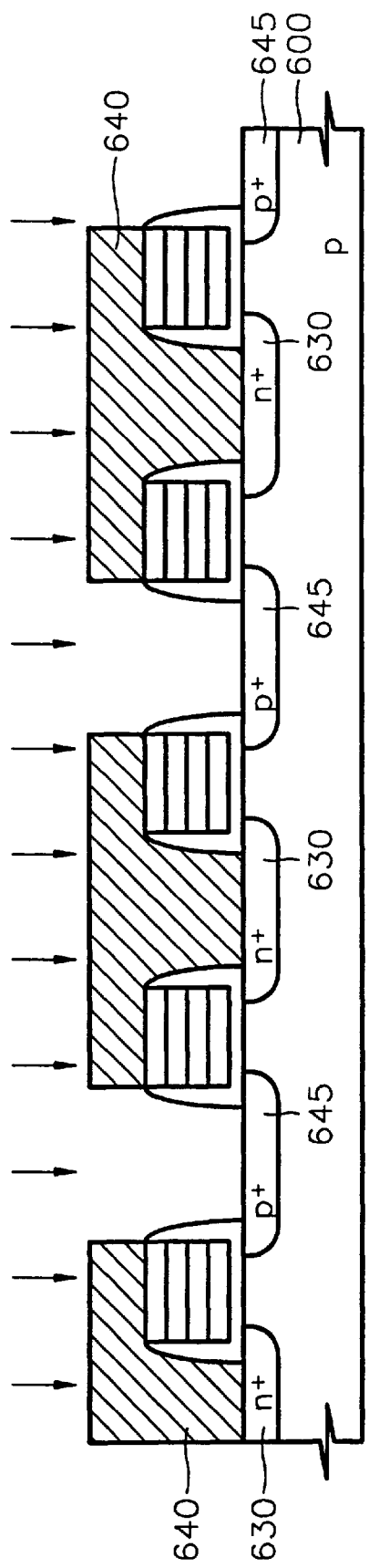

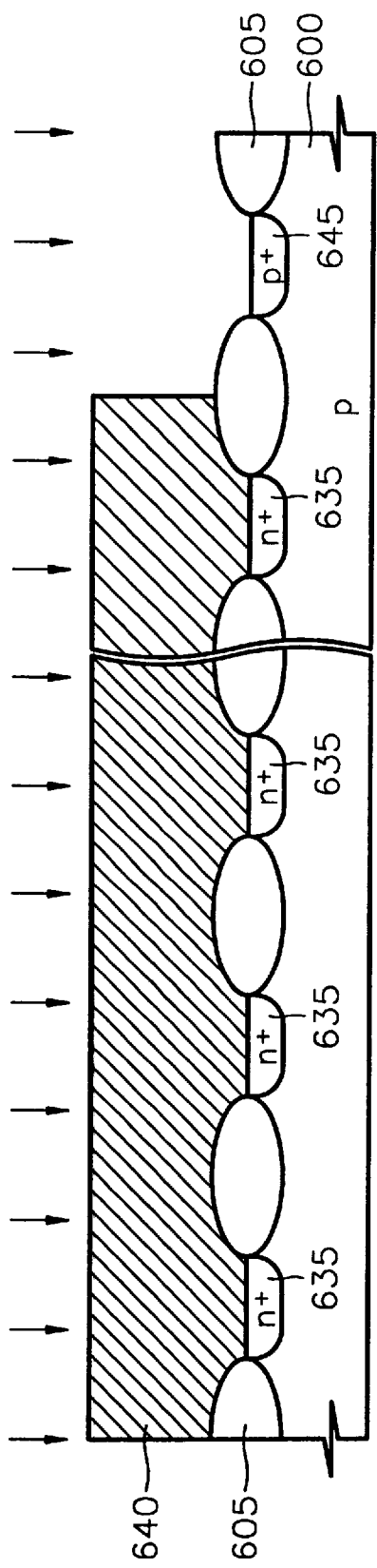
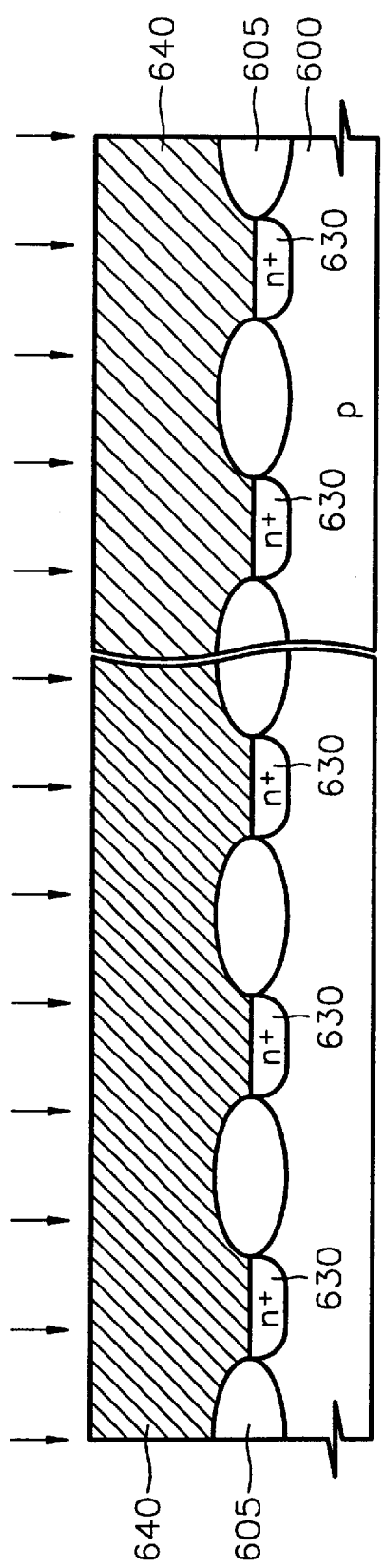

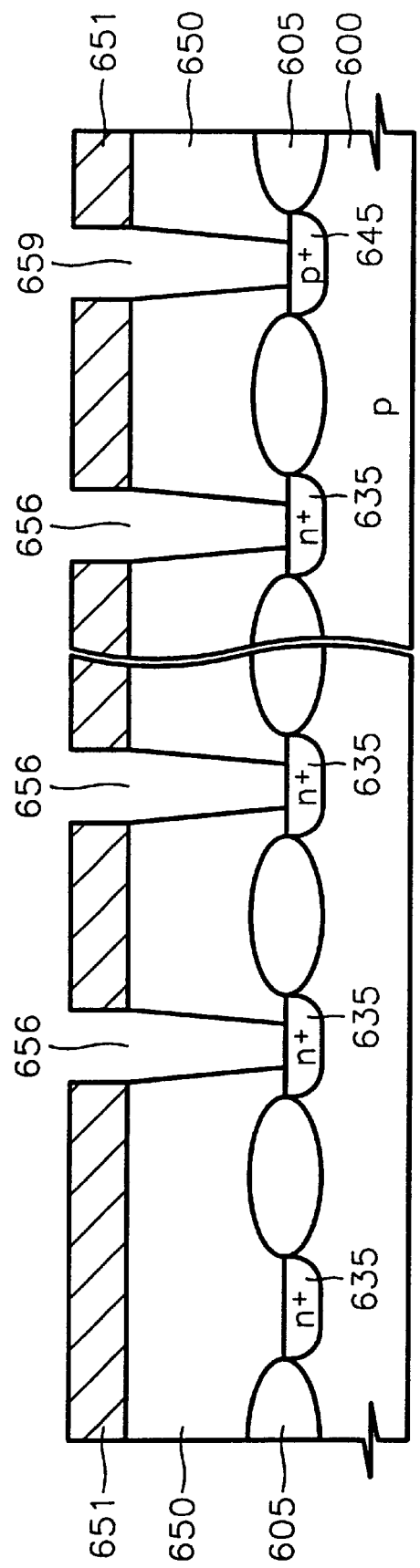
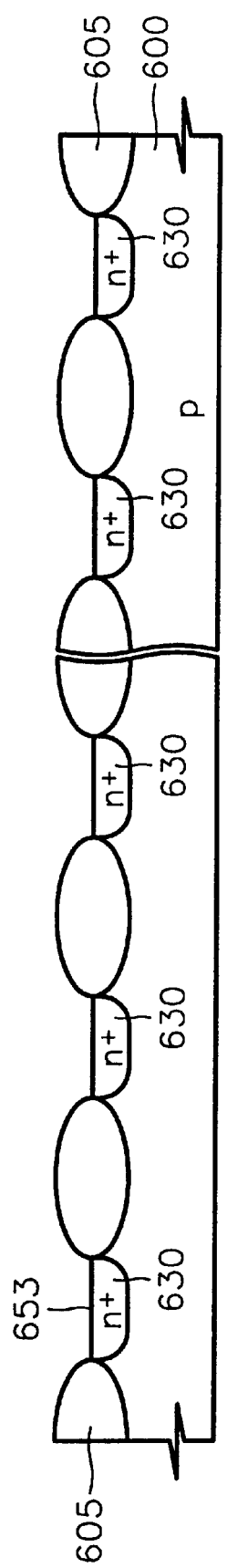
FIG. 31C
FIG. 31D

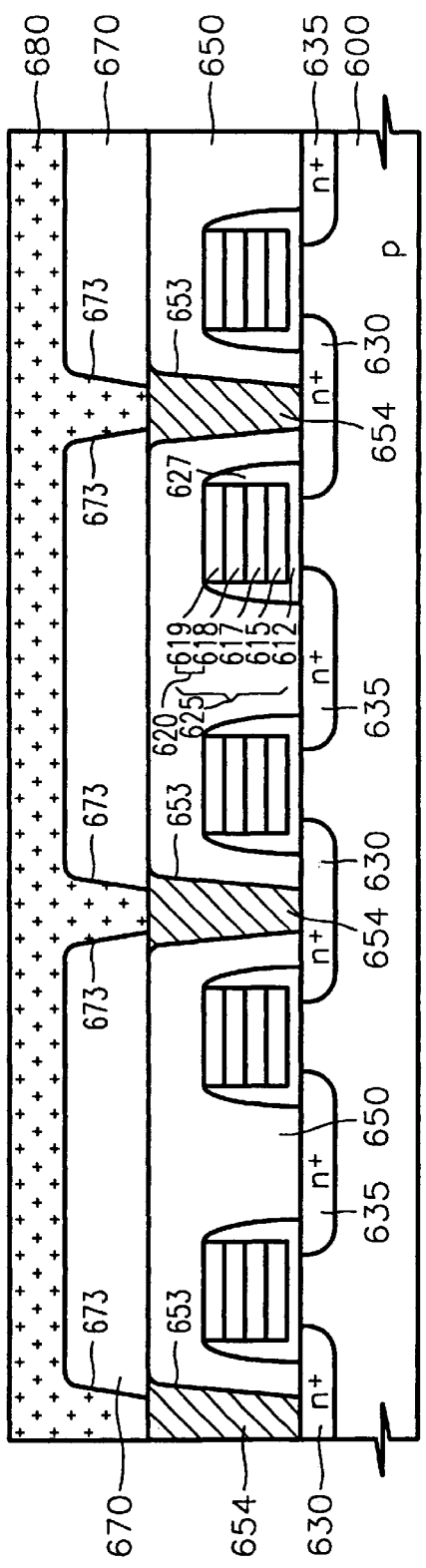
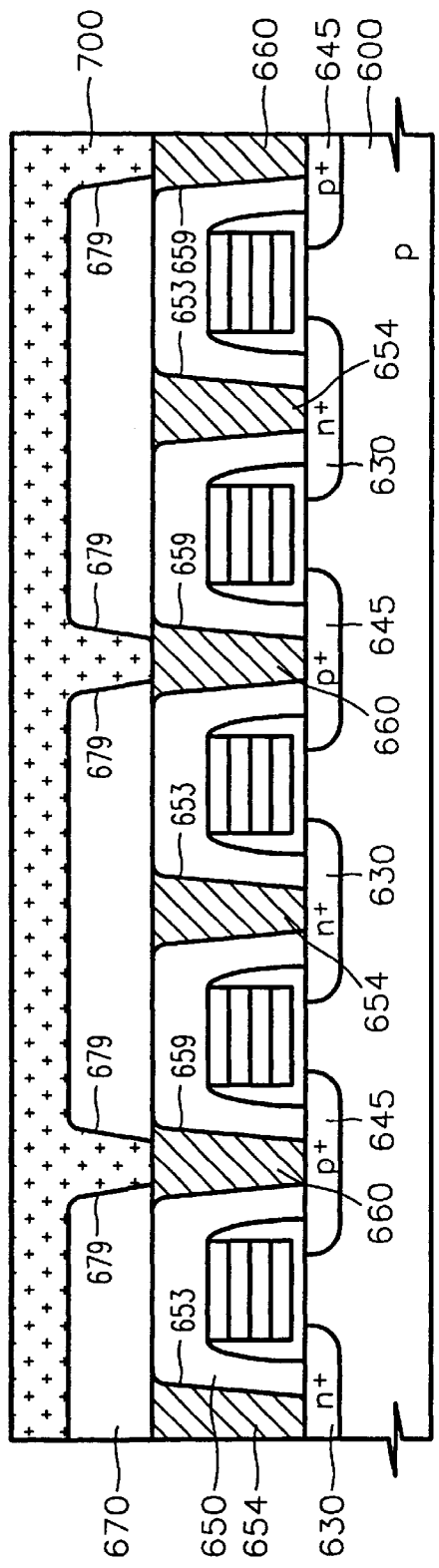

NONVOLATILE MEMORY DEVICE HAVING BULK BIAS CONTACT STRUCTURE IN CELL ARRAY REGION

BACKGROUND OF THE INVENTION

1. Field of the Invention

The present invention relates to a non-volatile memory device and a method of fabricating the same, and more particularly, to a non-volatile memory device having a bulk bias contact structure in a cell array region.

2. Description of the Related Art

Non-volatile memory devices are widely used for computers or memory cards because the non-volatile memory devices retain information stored in their memory cells even when no power is supplied.

Phenomena affecting the operating characteristics of non-volatile memory devices will be described with reference to FIG. 1 which is a partially-magnified circuit diagram of non-volatile memory devices. When a cell indicated by reference character A is to be selectively programmed, a program voltage $V_{PG}$, for example, 10 to 15 V, is applied to a selected word line WL1 which is connected to the cell A, and a voltage of about 5 V is applied to a selected bit line BL1 which is connected to the cell A. A non-selected bit line BL2 is connected to a cell that is adjacent to the selected cell A and shares the word line WL1 with the selected cell A. The non-selective bit line BL2 is floated. Also, a non-selected word line WL2 is connected to a cell B that is adjacent to the selected cell A and shares the bit line BL1 to which about 5 V is applied, with the selected cell A. The non-selected word line WL2 is grounded. When the cell A is selectively programmed as described above, an electrical field in the channel region under the gate of the selected cell A remarkably increases in a pinch-off region around the drain of the selected cell A, so that electrons within the channel are accelerated by this strong electrical field and easily achieve in a high energy state. The electrons in a high energy state collide with a silicon lattice in a bulk region, generating a plurality of electron-hole pairs. Some electrons with high energy, among electrons and holes, generated by impact ionization, are injected into a floating gate via a tunnel oxide film by a gate electrical field, and the other electrons, i.e., most of the electrons, are led to the drain by a strong drain electrical field, and become part of the drain current. At this time, holes are pushed in the opposite direction to the electrons by the drain electrical field, and flow into a source terminal or bulk terminal via a depletion layer or a bulk region under a channel. Therefore, hole current, that is, bulk current $I_{BULK}$, flows via the drain of the selected cell A and a bulk region. The bulk current $I_{BULK}$ increases a bulk voltage due to bulk resistance $R_{BULK}$. When a bulk voltage becomes 0.6 V or more due to a large bulk resistance $R_{BULK}$, a p-n junction between a source region, which is a ground node, and a substrate is forward biased, and thus undesired forward current is generated, thereby causing a snap back phenomenon in which cell current rapidly increases. Hence, cells may abnormally operate, or the junctions of cells may be destroyed by excessive current.

Meanwhile, a voltage $V_{FG}$ which is induced in the floating gate of the non-selected cell B is expressed by Equation 1 using a cell equivalent circuit shown in FIG. 2:

$$V_{FG}=(C_D\times V_D)+(C_{IPO}+C_D+C_B+C_S) \quad (1)$$

wherein $C_{IPO}$ is the capacitance between a control gate and a floating gate, $C_D$ is the capacitance between the floating gate and drain, $C_S$ is the capacitance between the floating gate and source, $C_B$ is the capacitance between the floating gate and a bulk region, and $V_D$ is a voltage which is applied to the drain, i.e., a voltage which is applied to a bit line. Equation 1 refers to the case in which the control gate voltage $V_{CG}$, the source voltage $V_S$ and the bulk voltage $V_B$ of the non-selected cell B are assumed to be 0 V.

It can be seen from Equation 1 and FIG. 2 that the voltage $V_{FG}$ which is induced in the floating gate of the non-selected cell B is proportional to a voltage which is applied to the bit line BL1. If the non-selected cell B is an over-erased cell having a threshold voltage of a predetermined level or less (about 1 V), when a voltage of about 5 V is applied to the bit line BL1 to program the cell A, a predetermined voltage is induced in the floating gate of the non-selected cell B, which may turn on the cell B. This is referred to as a drain turn on (DTO) phenomenon which causes leakage current, i.e., drain turn on current $I_{DTO}$, to flow from the bit line BL1 into a common source line CSL via the cell B. Once the cell B is turned on by the DTO phenomenon, the voltage of the bit line BL1 is reduced. This causes difficulty in programming the selected cell A. In addition, the DTO current $I_{DTO}$ increases with an increase in the number of non-selected cells connected to a bit line. Also, the DTO phenomenon becomes more serious as the bulk voltage is increased by the bulk current IBULK in the selected cell A.

In order to solve the above problem, a bulk bias contact structure is formed to prevent a bulk voltage from increasing by discharging current which flows into the bulk region of cell transistors by applying a bias voltage to the bulk region. As shown in FIGS. 3 and 4, a conventional bulk bias contact is formed in the shape of a guard band 3 that surrounds a cell array region 1. Alternatively, as shown in FIGS. 5 and 6, the conventional bulk bias contact may be formed in the shape of a bulk bias contact structure 5 on peripheral circuit regions corresponding to four corner regions of the cell array region 1 or corresponding to two corner regions among the four corner regions of the cell array region 1. The bulk bias contact structure 5 can solve the defect of the guard band 3 which increases the area of the entire chip, because of its wide layout area. However, in unit cells which are distant from the bulk bias contact structure 5, a large amount of bulk resistance is exhibited because of the long discharge path of the bulk current. Thus, the discharge effect of the bulk current is reduced, and the discharge effect of the bulk current is not uniform with respect to the position of unit cells.

A bulk bias contact structure, a guard band, an electro-static discharge prevention bulk bias contact structure, or the like have been formed in the active region of the peripheral circuit regions, in addition to the bulk bias contact structure in the cell array region for preventing the bulk voltage therein from being increased. The bulk bias contact structure maintains the bulk voltage of peripheral circuit regions at or below a predetermined voltage. The guard band prevents a latch-up phenomenon, or the like, which occurs between transistors for peripheral circuits.

As shown in FIG. 7, conventional bulk bias contact structures for maintaining the bulk voltage in a cell array region or peripheral circuit region at or below a predetermined voltage, are formed in the active region between isolation films 30' which are formed in the peripheral circuit regions on a semiconductor substrate 10. Specifically, a region 40 doped at high concentration with impurities of a conductivity type that is the same as the conductivity type of the impurities of a bulk region, is exposed. And a contact hole between interlayer dielectric layers 34' is filled with a metal film pattern 50, thereby completing the formation of the bulk bias contact structure. In order for the bulk bias contact structure to have a sufficient contact area, the area of the active region must be increased in consideration of the so-called bird's beak phenomenon in which the isolation films 30' grow toward the active region, upon layout. That is, in FIG. 7, the length of an actually-formed active region is d1, but the active region must be increased to a length of d2 upon layout. Therefore, an active region of a predetermined length d2 or greater is required to complete the bulk bias contact structure. As a result, the area of the entire chip increases by the length of the active region, inhibiting high integration of semiconductor devices.

SUMMARY OF THE INVENTION

An object of the present invention is to provide a non-volatile memory device which an maintain a bulk voltage at or below a predetermined voltage by rapidly discharging bulk current and has a uniform bulk current discharge effect regardless of the position of unit cells.

Another object of the present invention is to provide a non-volatile memory device which can be highly integrated by reducing a chip area by minimizing a layout area for forming a bulk bias contact structure.

To achieve the first object, the present invention provides a non-volatile memory device including a cell array region having a plurality of parallel bit lines, a plurality of parallel word lines, a plurality of memory cells, and a plurality of common source lines, the plurality of bit lines being orthogonal to the plurality of word lines, each of the memory cells being connected to a bit line and a word line and having a stacked gate comprised of a floating gate and a control gate and source/drain region, the plurality of common source lines being parallel to the plurality of bit lines. The non-volatile memory device also includes a peripheral circuit region for driving the memory cells in the cell array region is formed. The cell array region includes one or more bulk bias contact structures for maintaining the voltage of a bulk region in which the cell array region is formed, at or below a predetermined voltage.

Preferably, the one or more bulk bias contact structures are formed on the semiconductor substrate exposed by removing an isolation layer from a predetermined place of the cell array region.

The bulk bias contact structure is connected to common source lines, and thus the common source lines also act as bulk bias lines. In another aspect, the bulk bias contact structure is connected to bulk bias lines which are independent of common source lines. At this time, it is preferable that the bulk bias lines are formed at positions where conventional common source lines are formed. Alternatively, the bulk bias contact structure may be connected to dummy bit lines which are formed to reduce the loading effect which is caused upon fabrication.

The distance between a cell and a bulk bias contact of a non-volatile memory device according to the present invention can be significantly reduced without enlarging the area of a memory cell array. Therefore, the voltage of a bulk on which memory cells are formed can be effectively maintained at or below a predetermined voltage.

BRIEF DESCRIPTION OF THE DRAWINGS

The above objects and advantages of the present invention will become more apparent by describing in detail preferred embodiments thereof with reference to the attached drawings in which:

FIGS. 16A, 16B, 16C and 16D are cross-sectional views taken along lines a–a', b–b', c–c', and d–d' of FIG. 15, respectively;

FIGS. 20A through 28B are cross-sectional views illustrating a method of fabricating a non-volatile memory device according to a first embodiment of the present invention;

FIGS. 29A through 33D are cross-sectional views illustrating a method of fabricating non-volatile memory device according to a third embodiment of the present invention.

DESCRIPTION OF THE PREFERRED EMBODIMENTS

Figure 1:
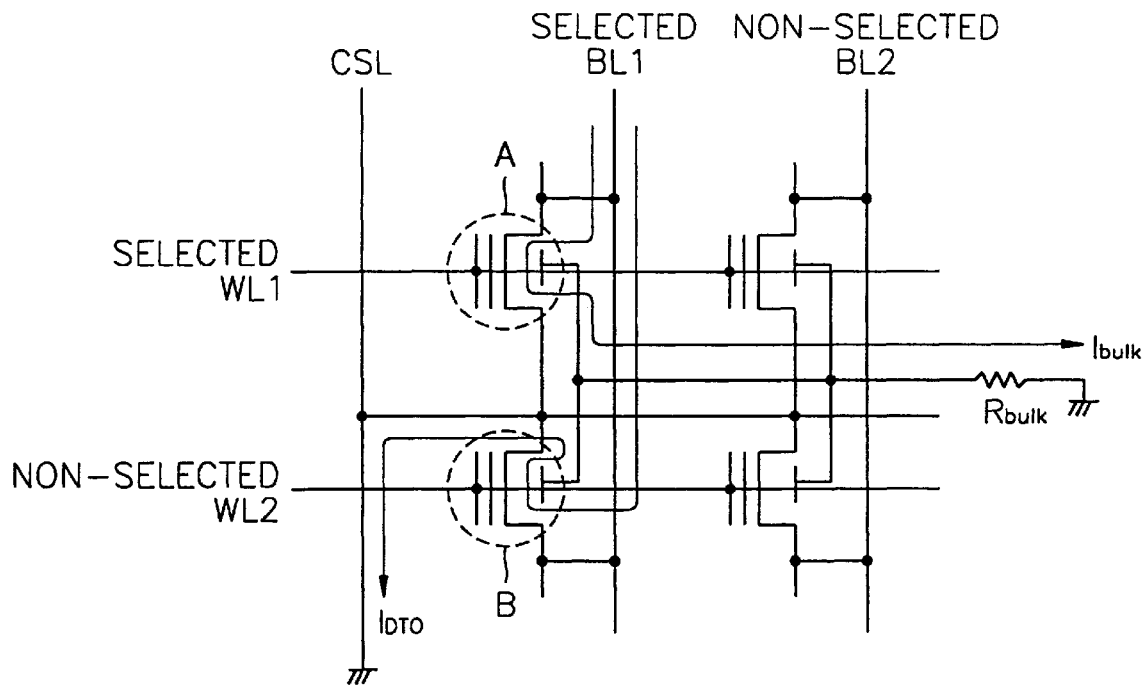
FIG. 1 is an equivalent circuit diagram illustrating a drain turn on phenomenon of non-selected cells when a non-volatile memory device is programmed.
Figure 2:
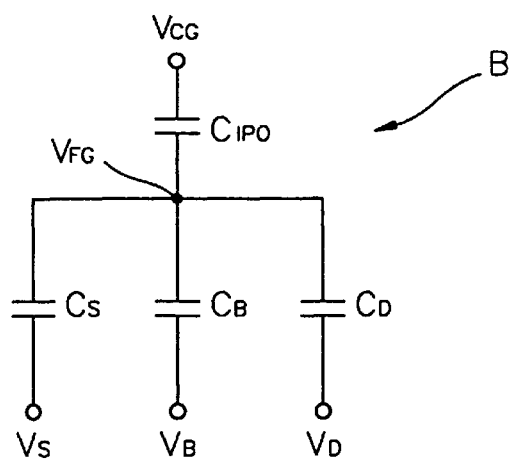
FIG. 2 is an equivalent circuit diagram of a non-selected cell B shown in FIG. 1.
Figure 3:
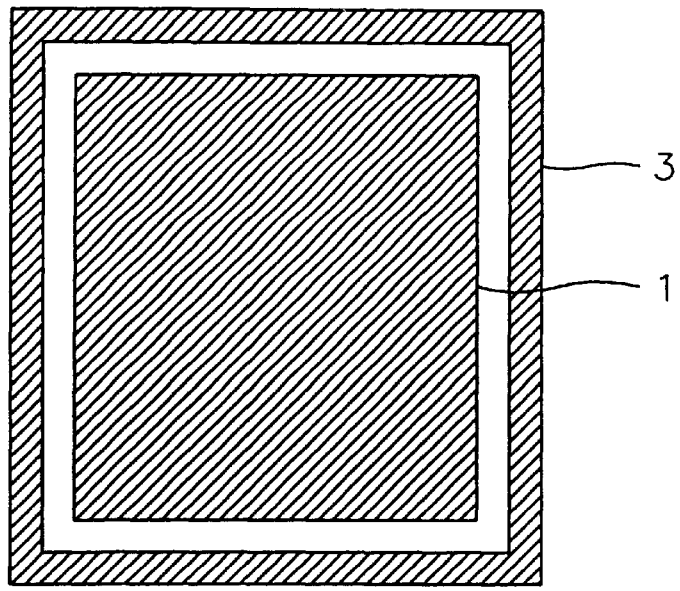
FIGS. 3 through 6 are plan views illustrating the position of a bulk bias contact structure with respect to a cell array region in a conventional non-volatile memory device.
Figure 4:
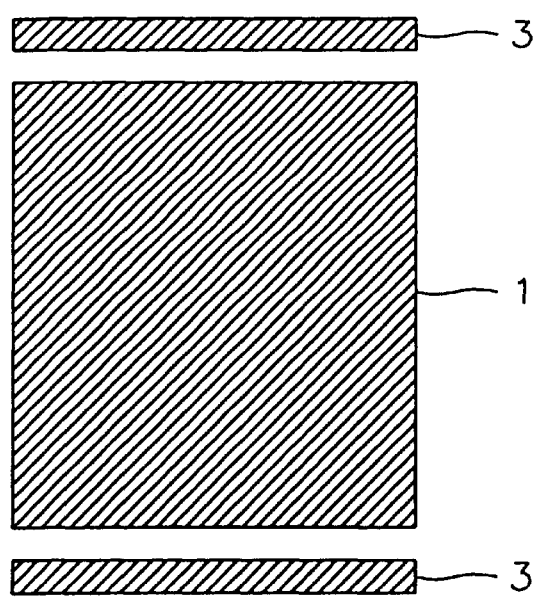
Figure 5:
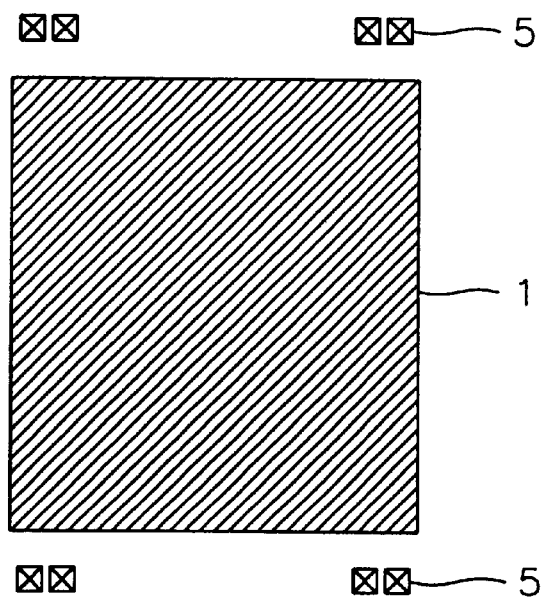
Figure 6:
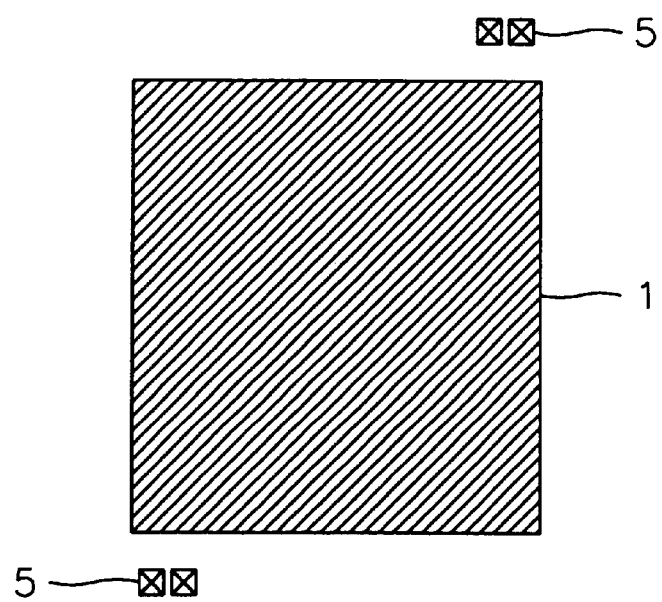

Hereinafter, embodiments of the present invention will be described in detail with reference to the attached drawings. However, the embodiments of the present invention can be modified into various other forms, and the scope of the present invention must not be interpreted as being restricted to the embodiments set forth herein. The embodiments are provided to more completely explain the present invention to those skilled in the art. In the drawings, the thicknesses of layers or regions are exaggerated for clarity. Also, when it is written that a layer is formed "on" another layer or a substrate, the layer can be formed directly on the other layer or the substrate, or other layers can be formed therebetween. Like reference numerals in the drawings denote the same members.

Non-volatile Memory Device

First Embodiment

Figure 8:
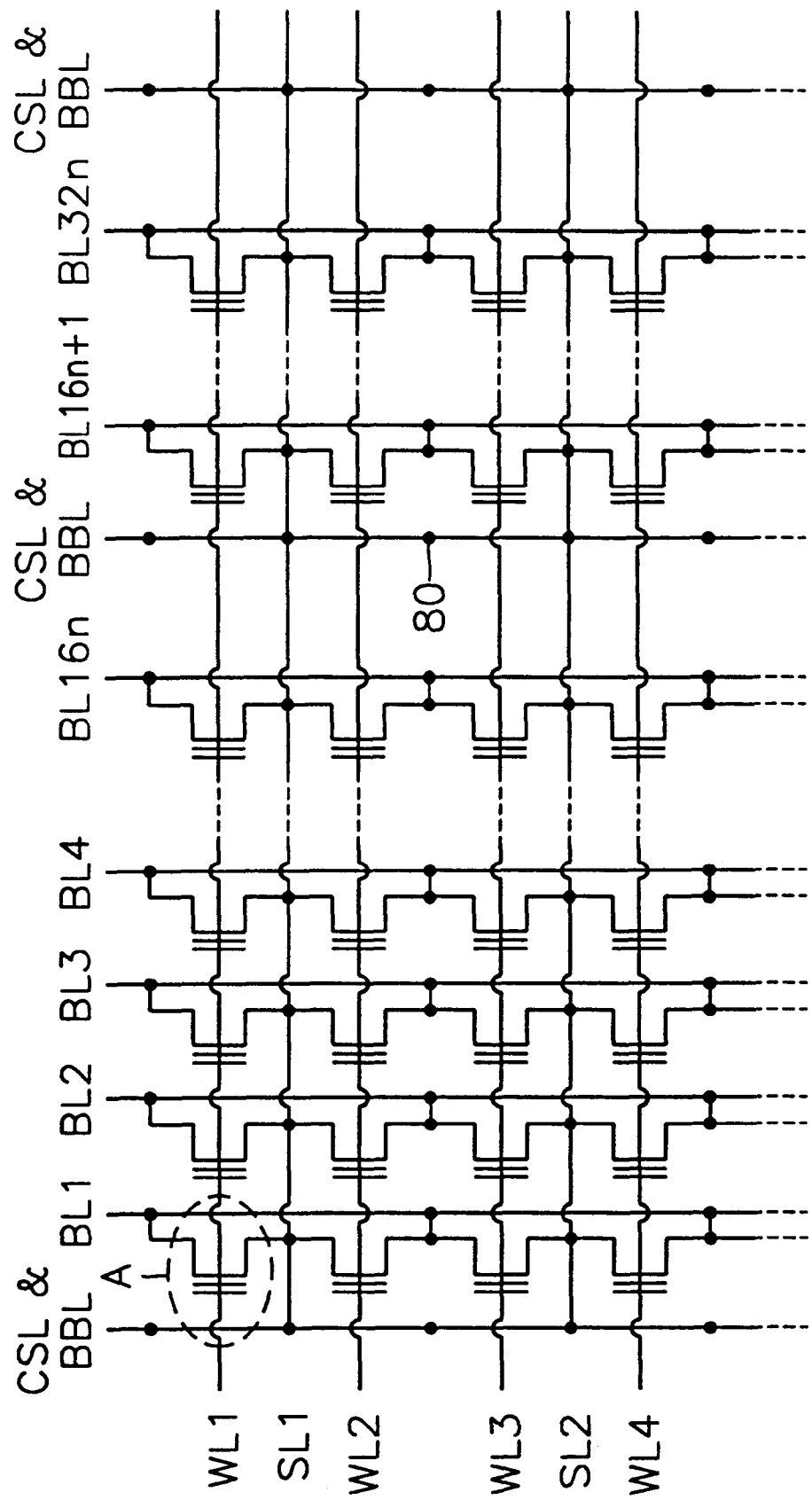
FIG. 8 is an equivalent circuit diagram of a cell array region in a non-volatile memory device according to a first embodiment of the present invention.

Referring to FIG. 8, a non-volatile memory device according to a first embodiment of the present invention includes at least one bulk bias contact structure 80 in a cell array region, in contrast to a conventional non-volatile memory device having a bulk bias contact in a peripheral circuit region. The bulk bias contact structure 80 is used to maintain the voltage of a bulk region in which a cell array region is formed, at or below a predetermined voltage. Specifically, a plurality of memory cells formed in regions where a plurality of parallel bit lines BL and a plurality of parallel word lines WL cross each other at right angles are arranged in a matrix shape in a cell array region. The source regions of memory cells which are adjacent to each other in a direction parallel to a word line WL are connected to source lines SL, and the source lines SL are connected to a common source line CSL. Preferably, the bulk bias contact structure 80 is connected to the common source line CSL which connects a plurality of source lines SL for connecting the source regions of a plurality of memory cells which are adjacent to each other in a direction parallel to the word lines WL. It is preferable that the non-volatile memory device of the first embodiment of the present invention be designed in a way that the common source line CSL also functions as a bulk bias line BBL.

The common source line CSL and the bulk bias line BBL can be formed in one line for the following reason.

When a cell indicated by reference character A is to be selectively programmed, a first voltage $V_{PG}$, for example, 10 to 12 V, is applied to a word line connected to the cell A, and a second voltage, for example, 5 to 7 V, is applied to a bit line connected to the selected cell A. Bit lines BL2, BL3, . . . connected to cells which are adjacent to the selected cell A and share a word line WL1 are floated. Also, word lines WL2, WL3, . . . connected to cells that are adjacent to the selected cell A and share the bit line BL1 to which the second voltage has been applied, are grounded. A third voltage, for example, 0 V, is applied to the common source line and the bulk bias line. That is, the same voltage is applied to a source region and a bulk region upon programming, so that the common source line CSL and the bulk bias line BBL can be formed of the same line. Also, even when the same voltage is applied to both the source region and the bulk region upon erasing, there is no influence upon erasing operation.

Figure 9:
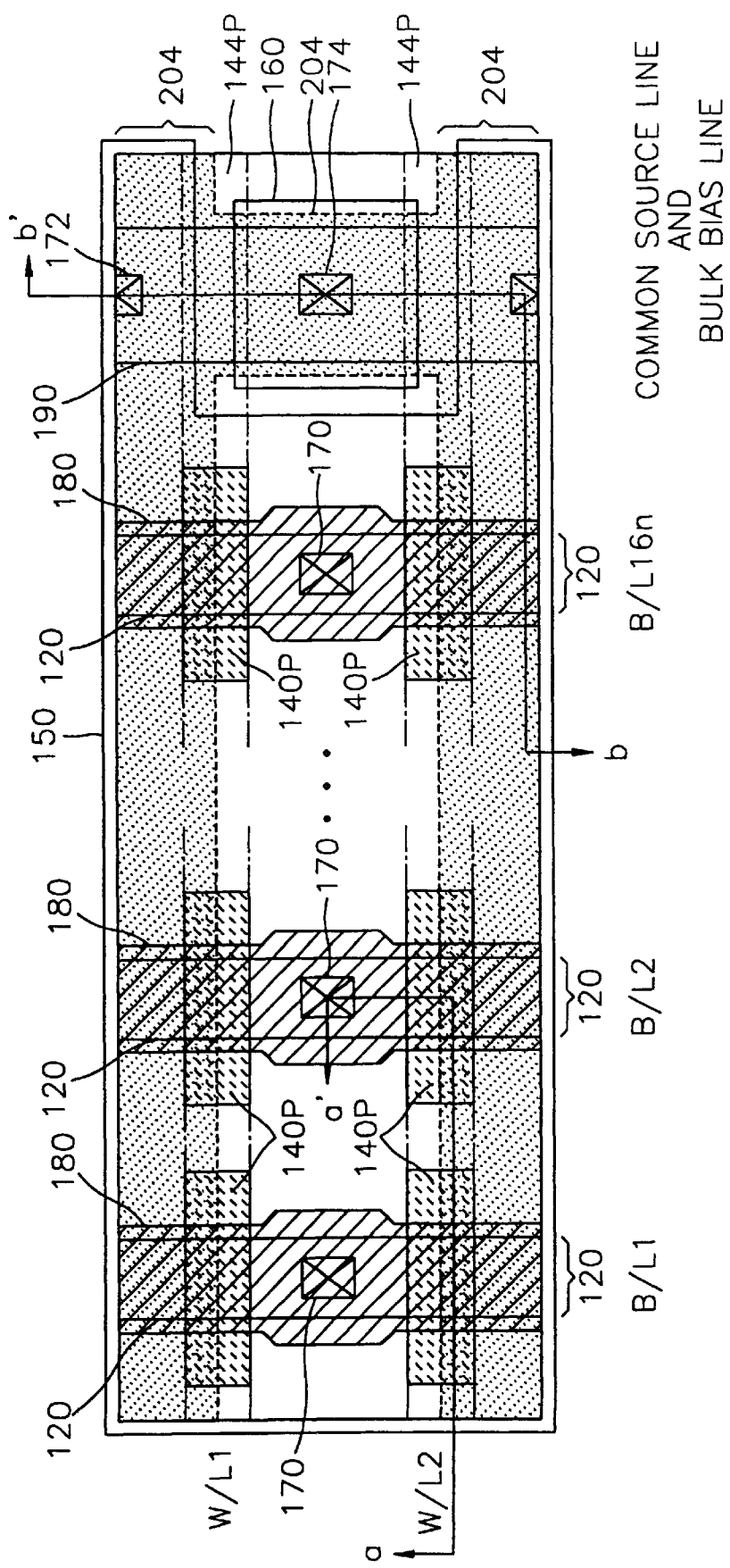
FIG. 9 is a layout view of part of the cell array region of FIG. 8.
Figure 10A:
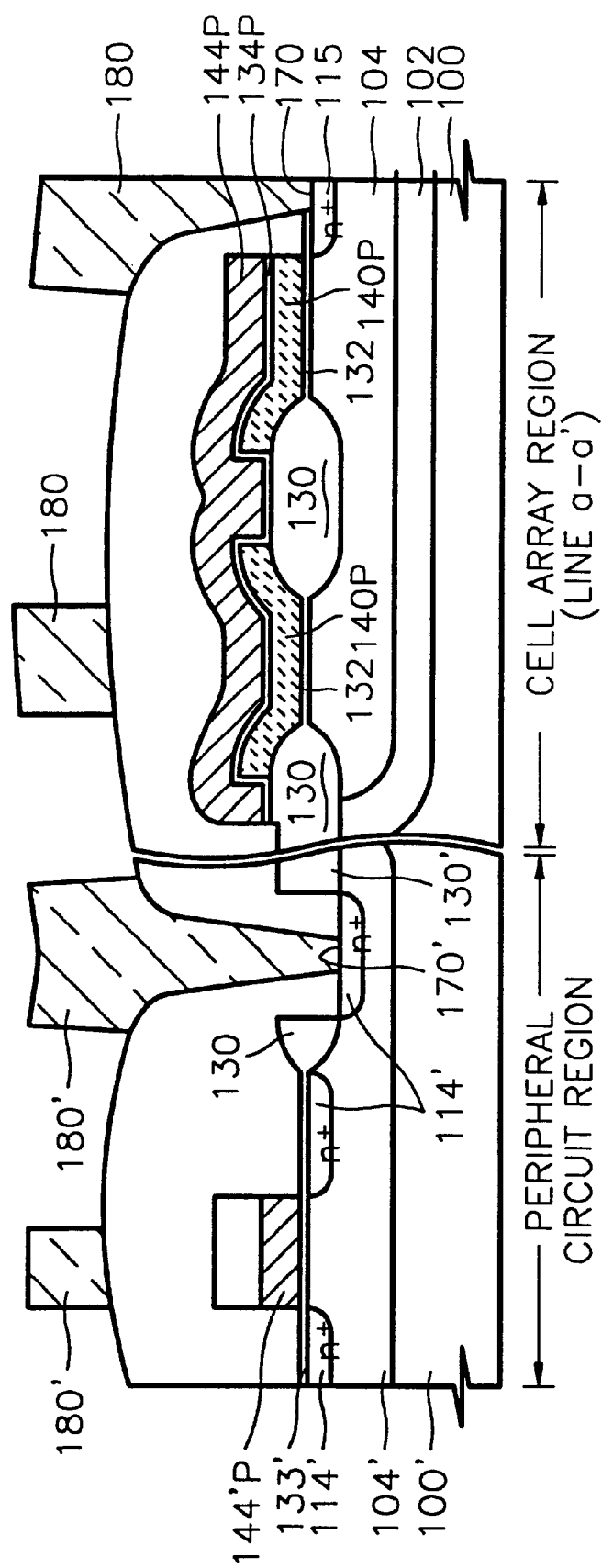
FIGS. 10A and 10B are cross-sectional views taken along lines a–a' and b–b' of FIG. 9, respectively.
Figure 10B:
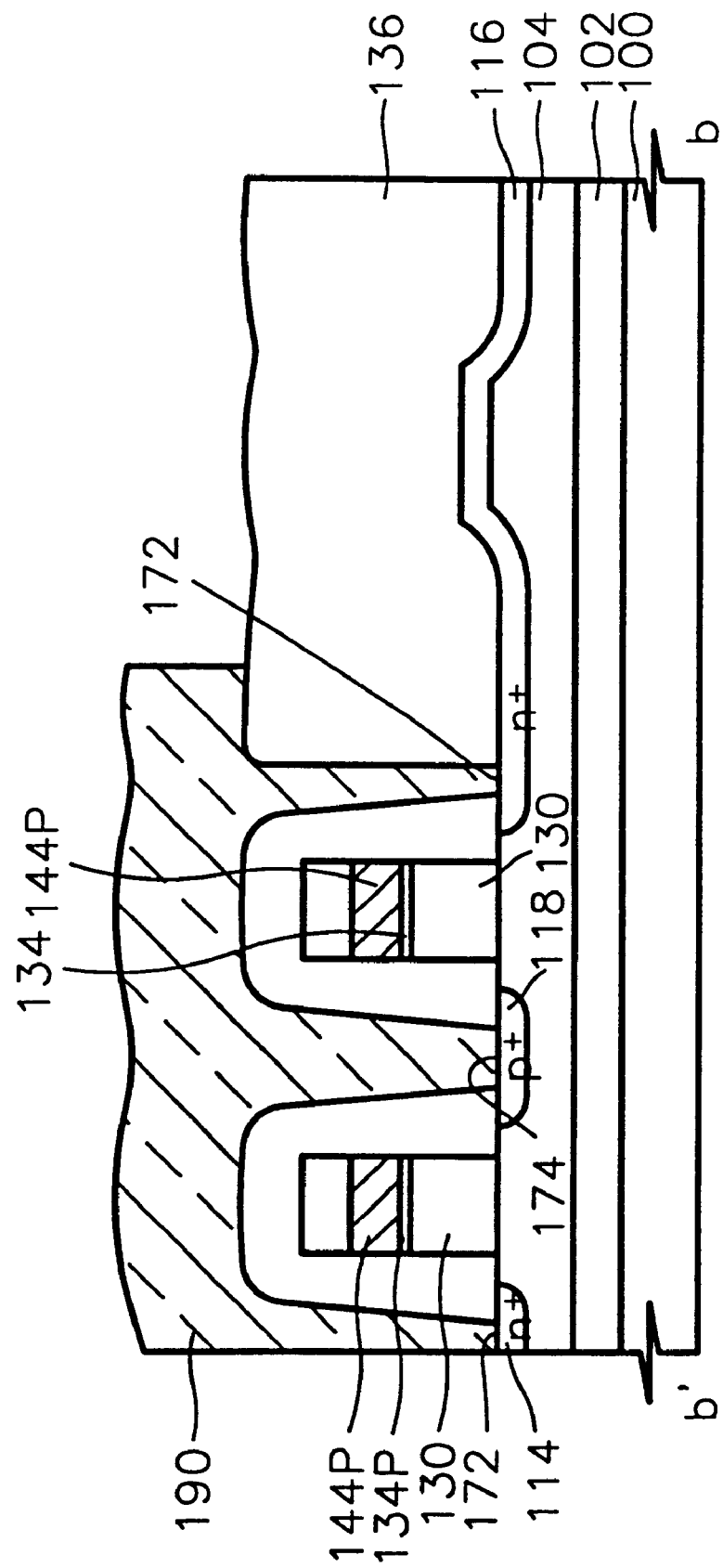

FIG. 9 is a layout view of part of the cell array region in the non-volatile memory device according to the first embodiment of the present invention. In FIG. 10A, the right side is a cross-sectional view taken along the line a–a' of FIG. 9, and the left side is a cross-sectional view of a peripheral circuit region. FIG. 10B is a cross-sectional view taken along the line b–b' of FIG. 9.

In FIG. 9, reference numeral 120 is an active region pattern, reference numeral 140P is a floating gate pattern, reference numeral 144P is a control gate pattern which acts as a word line, and reference numeral 150 is an ion implantation mask pattern for forming a source, a drain and an impurity diffusion region for use as a source line. Also, reference numeral 160 is an ion implantation mask pattern for forming a bulk bias junction, reference numeral 170 is a bit line contact hole pattern, reference numeral 172 is a common source line contact hole pattern, reference numeral 174 is a bulk bias line contact hole pattern, reference numeral 180 is a bit line pattern, reference numeral 190 is a common source line and bulk bias line pattern, and reference numeral 204 is an etch mask pattern for exposing the impurity diffusion region for use as a source line and a semiconductor substrate region in which the bulk bias junction is to be formed.

Referring to FIGS. 9, 10A and 10B, the active region 120 is defined by a plurality of parallel isolation films 130 extending in one direction on a semiconductor substrate 100. The ell array region is formed on a pocket P-type well 104 within an N-type well 102 formed within a P-type substrate 100, and the peripheral circuit region is formed within a P-type well 104' formed within the P-type substrate 100', or within an N-type well (not shown), or within a pocket P-type well (not shown). A plurality of memory cells are arranged on the active region 120 in the cell array region. Each cell has a stacked gate structure including a tunneling dielectric layer 132, a floating gate 140P, an inter-gate dielectric layer 134P, and a control gate 144P. A source region 114 and a drain region 115 are formed in the active region 120 between stacked gates. The floating gates 140P are formed over some portions of the active region 120 and the isolation film 130, and the control gates 144P which act as word lines extend across the active region 120 perpendicular thereto. Consequently, one memory cell is formed in each region where the active region 120 and the control gate 144P cross orthogonal to each other, and thus the memory cells are arranged in a matrix shape.

The cell in the peripheral circuit region comprises a single layer gate structure including a gate dielectric layer 133' and a gate electrode 144'P formed as the same layer as the control gate 144P, and includes a source region and a drain region 114'.

The floating gate 140P is formed of polycrystalline silicon, and the control gate 144P may be formed of a polycrystalline silicon single layer or a multi-layer including a polycrystalline silicon layer and a silicide layer. The inter-gate dielectric layer is a stacked-type dielectric layer (for example, ONO film) with an oxide film and a nitride film, or a high dielectric metal oxide film.

As shown in FIG. 10B, n-type source regions 114 of memory cells, which are adjacent to each other in the direction of the control gate 144P, are electrically connected to each other by a source line 116 formed of an n-type impurity-diffused region which is formed by etching of an isolation layer 130 between the source regions 114 using the etch mask pattern 204 of FIG. 9 and using a control gate 144P as a self-alignment mask. The source line 116 is connected to the common source line 190 via a common source line contact hole 172 formed within an interlayer dielectric layer 136.

A bulk bias contact structure for maintaining the voltage of a bulk region in which a cell array region has been formed, that is, the P-type pocket well 104 at or below a predetermined voltage, is connected to a bulk bias junction 118 formed by implanting p-type impurities, which are the same as the impurities of the P-type pocket well 104, into the P-type pocket well 104 using an ion implantation mask 160 of FIG. 9. It is preferable that the impurities for forming the bulk bias junction 118 are doped at a higher concentration than the impurities of the P-type pocket well 104. An increase in doping concentration of the bulk bias junction 118 can effectively prevent the voltage of the P-type pocket well 104 from increasing.

The bulk bias junction 118 is formed within the P-type pocket well 104 that has been exposed by removing the isolation layer 130 between the control gates 144P. In particular, the isolation layer 130 to be removed is formed in a region where the common source line 190 and a line for connecting drain regions 115 adjacent to each other in the direction of the control gate 144P, cross each other at right angles. The bulk bias line contact hole 174 which exposes the bulk bias junction 118 alternates with the common source line contact hole 172. Thus, the common source line 190 is connected to the source line 116 and also to the bulk bias junction 118, such that it also functions as a bulk bias line.

In the peripheral circuit region, the bulk bias contact structure is also formed to contact with a junction 114' formed within the p-type well 104' that has been exposed by removing the isolation film 130. The conductivity type of impurities implanted into the p-type well 104' that has been exposed by removing the isolation film 130 from the peripheral circuit region can be changed depending on the purpose of the bulk bias contact. If the bulk bias contact is a guard band bulk bias contact for preventing latch up or a bulk bias contact for preventing electro-static discharge (ESD), the junction 114' is formed of impurities having a conductivity type that is opposite to the P-type well 104', as shown in FIG. 10A. If the bulk bias contact is a guard band bulk bias contact for device isolation, the junction 114' is formed of impurities having the same conductivity type as that of the P-type well 104'.

In the non-volatile memory device according to the first embodiment of the present invention, a bulk bias contact structure is included in a cell array region. Thus, the voltage of a bulk region where a cell array region has been formed can be uniformly and precisely maintained at or below a predetermined voltage regardless of the location of memory cells.

Also, a bulk bias junction is formed by removing an isolation film, and a common source line is used as a bulk bias line which is connected to the bulk bias junction. Hence, there is no need to separately form the bulk bias line within the cell array region upon layout, thus preventing increases in layout area.

Furthermore, a bulk bias contact to be formed in a peripheral circuit region is also formed by removing an isolation film. Thus, an active region for forming the bulk bias contact is not required in contrast to a conventional method of forming a bulk bias contact in an active region, thus reducing the valuable layout area of a chip.

Figure 7:
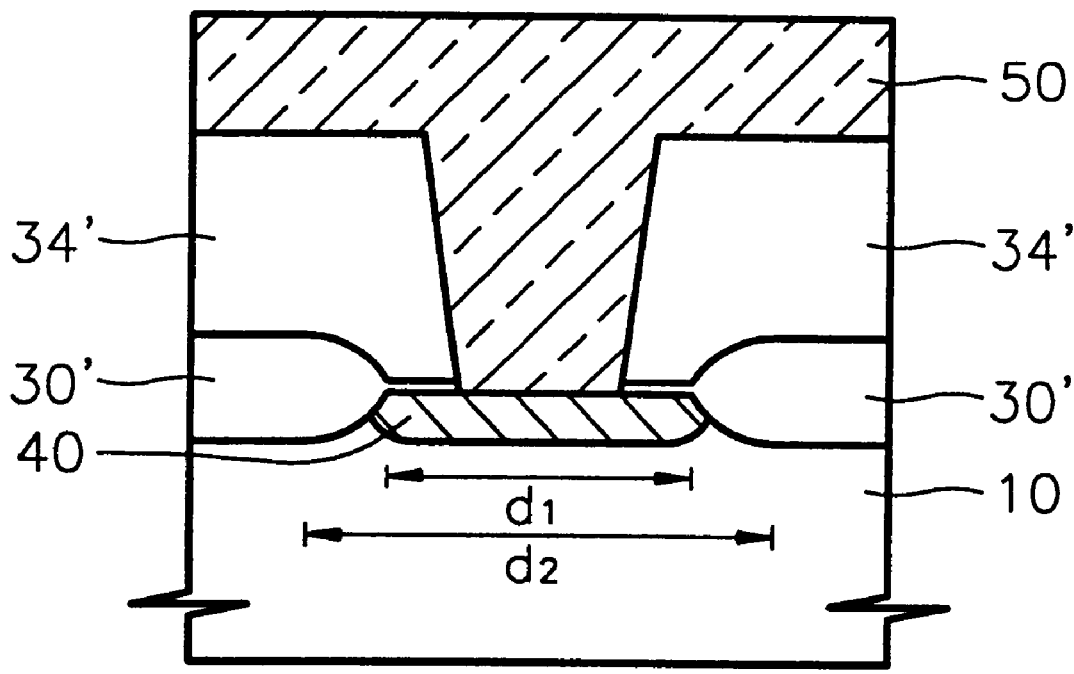
FIG. 7 is a cross-sectional view illustrating the case in which a conventional bulk bias contact is formed in the active region between isolation films.

As shown in FIG. 7, conventional bulk bias contact structures for maintaining the bulk voltage in a cell array region or peripheral circuit region at or below a predetermined voltage, are formed in the active region between isolation films 30' which are formed in the peripheral circuit regions on a semiconductor substrate 10. Specifically, a region 40 doped at high concentration with impurities of a conductivity type that is the same as the conductivity type of the impurities of a bulk region, is exposed. And a contact hole between interlayer dielectric layers 34' is filled with a metal film pattern 50, thereby completing the formation of the bulk bias contact structure. In order for the bulk bias contact structure to have a sufficient contact area, the area of the active region must be increased in consideration of the so-called bird's beak phenomenon in which the isolation films 30' grow toward the active region, upon layout. That is, in FIG. 7, the length of an actually-formed active region is d1, but the active region must be increased to a length of d2 upon layout. Therefore, an active region of a predetermined length d2 or greater is required to complete the bulk bias contact structure. As a result, the area of the entire chip increases by the length of the active region, inhibiting high integration of semiconductor devices.

Second Embodiment

Figure 11:
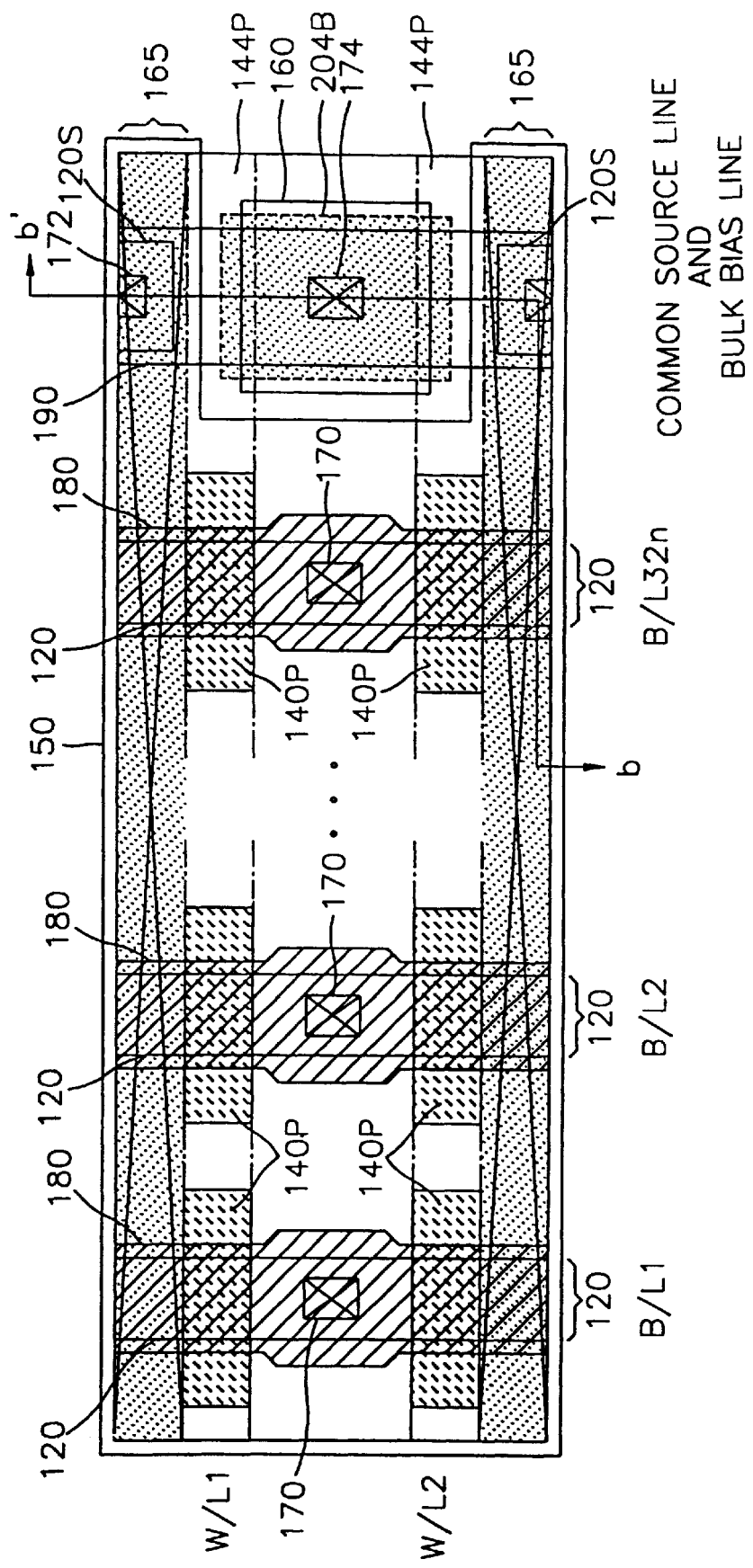
FIG. 11 is a layout view of part of a cell array region in a non-volatile memory device according to a second embodiment of the present invention.
Figure 12:
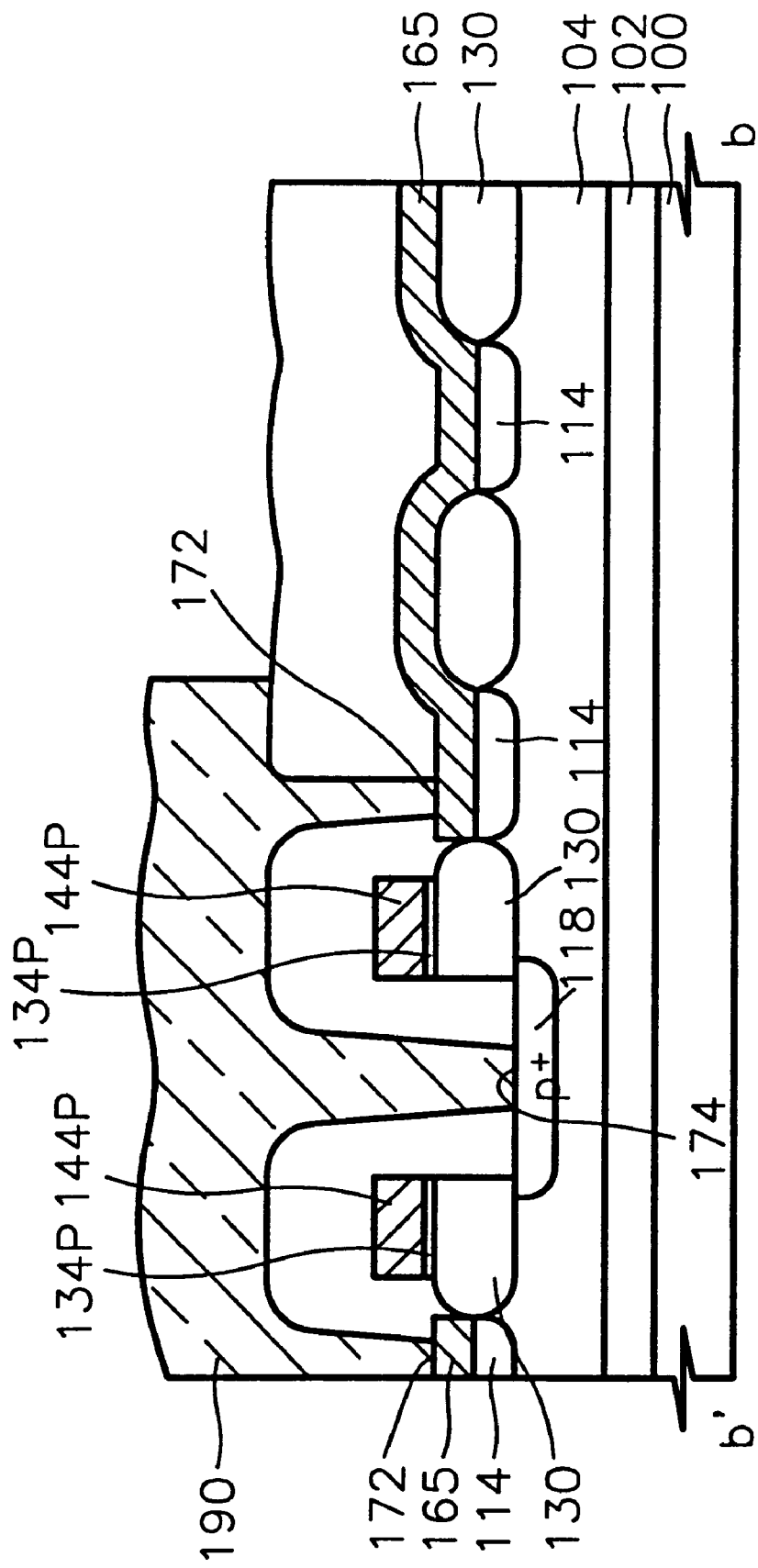
FIG. 12 is a cross-sectional view taken along line b–b' of FIG. 11.

FIG. 11 is a layout view of a non-volatile memory device according to a second embodiment of the present invention, and FIG. 12 is a cross-sectional view taken along line b–b' of FIG. 11.

The second embodiment is different from the first embodiment in that a source line is not formed of the impurity-diffused region 116 of FIG. 10 which connects the source region 114, but formed of a conductive film pattern 165 which is continuously formed on an isolation film 130 and connected to a source region 114. The conductive film pattern 165 is connected to the common source line 190 via the common source line contact hole 172. The conductive film pattern 165 is formed of a low-resistance metal such as polysilicon, polycide or tungsten. Thus, an etch mask 204 of FIG. 9 for removing an isolation film between source regions is not required to fabricate the non-volatile memory device according to a second embodiment.

The source region 114 which is formed under the common source line 190 may be formed on a semiconductor substrate exposed by removing an isolation film, similar to the first embodiment, or formed in an active region 120S which has been formed in advance, as shown in FIGS. 11 and 12. When the source region 114 is formed on the exposed semiconductor substrate, a p-type pocket well 104 on which the source region 114 and a bulk bias junction 118 are to be formed is exposed by removing an isolation film using an etch mask pattern (not shown) which simultaneously exposes the source region 114 and a region where the bulk bias junction 118 are to be formed. When the source region 114 is formed on the active region 120S, a p-type pocket well 104 on which the bulk bias junction 118 is to be formed is exposed by etching an isolation film using an etch mask pattern 204B of FIG. 11 which exposes only a region where the bulk bias junction 118 is to be formed.

According to the second embodiment, a source line for connecting the source regions of memory cells which are adjacent to each other in the direction of a word line 144P is formed of a conductive film pattern 165 of FIG. 12 rather than the impurity diffusion region 114 of FIG. 10B. The source line 165 formed of a conductive film pattern has a lower resistance than the source line 114 formed of an impurity-diffused region. The number of bit lines arranged between the common source line and bulk bias line (CSL & BBL) can be increased from 16n (where n is a positive integer, see FIG. 9) in the first embodiment to 32n (where n is a positive integer, see FIG. 11) or more. Therefore, the number of common source line and bulk bias lines (CSL & BBL) arranged within a cell array region can be reduced to half or less. Accordingly, the size of the cell array region can be reduced as compared to the first embodiment.

Third Embodiment

Figure 13:
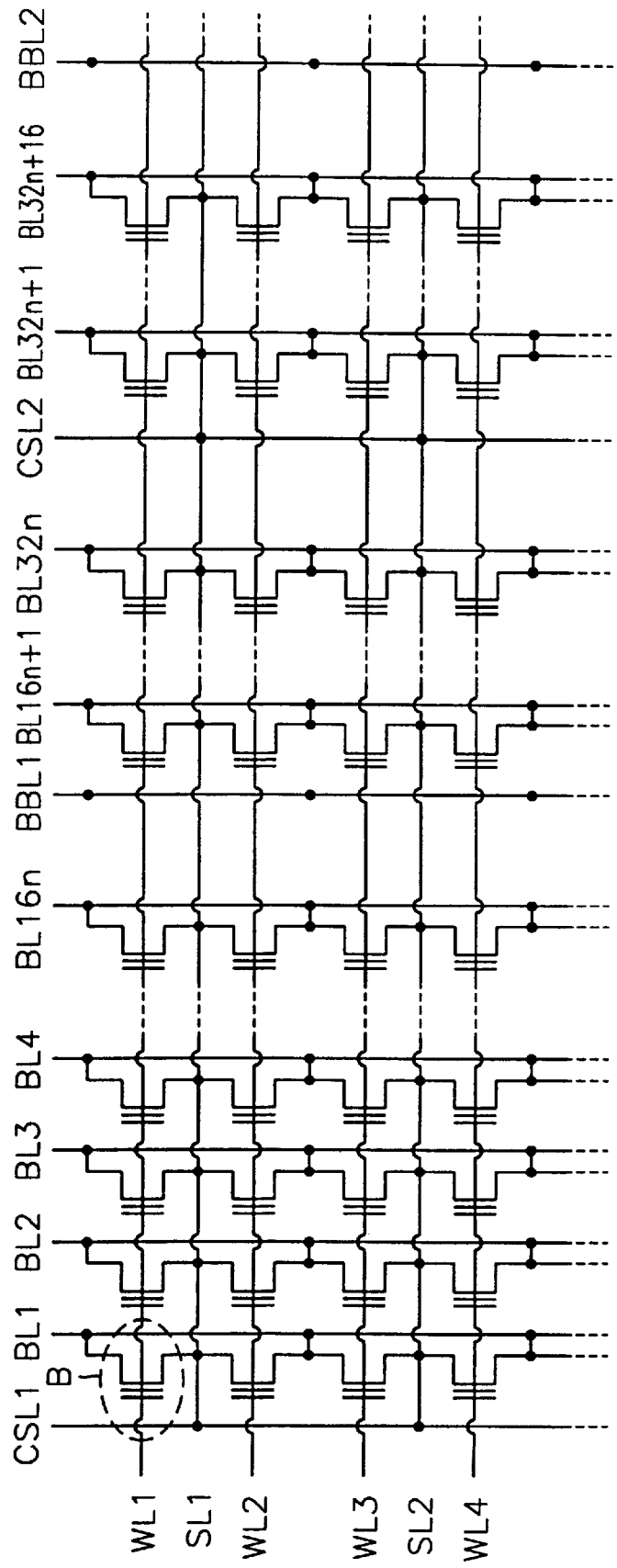
FIG. 13 is an equivalent circuit diagram of a cell array region in a non-volatile memory device according to a third embodiment of the present invention.

Referring to FIG. 13, a non-volatile memory device according to a third embodiment of the present invention is different from the first and second embodiments in that it includes bulk bias lines BBLs that are formed separately from the common source lines CSLs.

The arrangement in the third embodiment can be made by forming a source line SL with a metal line instead of an impurity diffusion layer that is generally used in the prior art. As described above in the second embodiment, the source line SL formed of a conductive layer pattern has a low resistance, so that the number of bit lines arranged between two common source lines CSL1 and CSL2 can be increased from 16n (n≧1 where n is an integer) in the prior art to 32n (n≧1 where n is an integer) or more. Accordingly, the number of common source lines CSLs arranged within a cell array can be reduced to half or less. Thus, if a bulk bias line BBL is formed where common source lines CSLs are formed in the prior art, a sufficient number of bulk bias lines BBL can be included in a cell array without increasing the area of the memory cell array. In other words, the bulk bias lines BBLs can be formed at intermediate positions between common source lines CSL. Therefore, 16n bit lines are arranged between the bulk bias line BBL and the common source line CSL.

Figure 14:
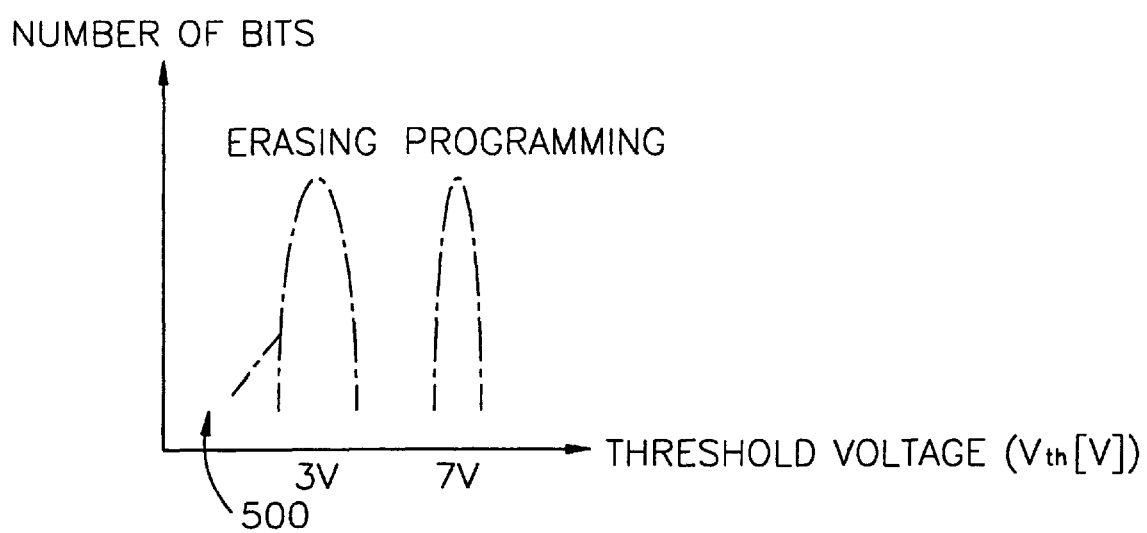
FIG. 14 is a graph showing the threshold voltage distributions of a cell upon programming and erasing.

The non-volatile memory device according to the third embodiment includes bulk bias lines BBLs which are independent from the common source lines CSL, so that it is suitable for a non-volatile memory device which is highly integrated and compact and thus requires a low operating voltage Vcc. With a decrease in operating voltage, the distribution of the threshold voltage (Vth) of an erased cell departs from a Gaussian normal distribution, and thus a tail bit 500 which has been over-erased is formed, as shown in FIG. 14. The tail bit 500 makes program current flow into an over-erased cell upon programming, so that a program failure, in which a cell intended to be programmed is not programmed, occurs. In this case, if a negative voltage is applied to a bulk region, the threshold voltage Vth of a cell increases, which prevents the program failure from occurring. Thus, if different biases are applied to a source region and a bulk region, the program failure can be effectively prevented. In order to apply different biases to the source region and the bulk region, common source lines CSL1, CSL2, . . . and bulk bias lines BBL1, BBL2, . . . must be connected to independent terminals.

For example, when a cell B is to be selectively programmed, a first voltage $V_{PG}$, for example, 10 V, is applied to a word line WL1 connected to the cell B, and a second voltage $V_{PG}$, for example, about 5 V, is applied to a bit line BL1 connected to the cell B. Bit lines BL2, BL3, . . . , to which cells which are adjacent to the selected cell B and share the word line WL1 are connected, are floated. Also, word lines WL2, WL3, . . . , to which cells which are adjacent to the selected cell B and share the bit line BL1 to which about 5 V has been applied are connected, are grounded. A third voltage, for example, 0 V, is applied to the common source line CSL1, and a fourth voltage, for example, −1 V, is applied to the bulk bias line BBL1, so that the program failure can be effectively prevented.

Also, since the selected cell B is close to the bulk bias line BBL1, the bulk voltage of the selected cell B can be more effectively maintained at or below a predetermined voltage than the prior art. Thus, malfunction in which non-selected cells are programmed by a drain turn on current or the like can be prevented.

The common source line CSL and the bulk bias line BBL may be connected to the same terminal and thus electrically connected to each other, as necessary. In this case, an identical voltage is applied to a source region and a bulk region upon programming, as described in the first embodiment.

Figure 15:
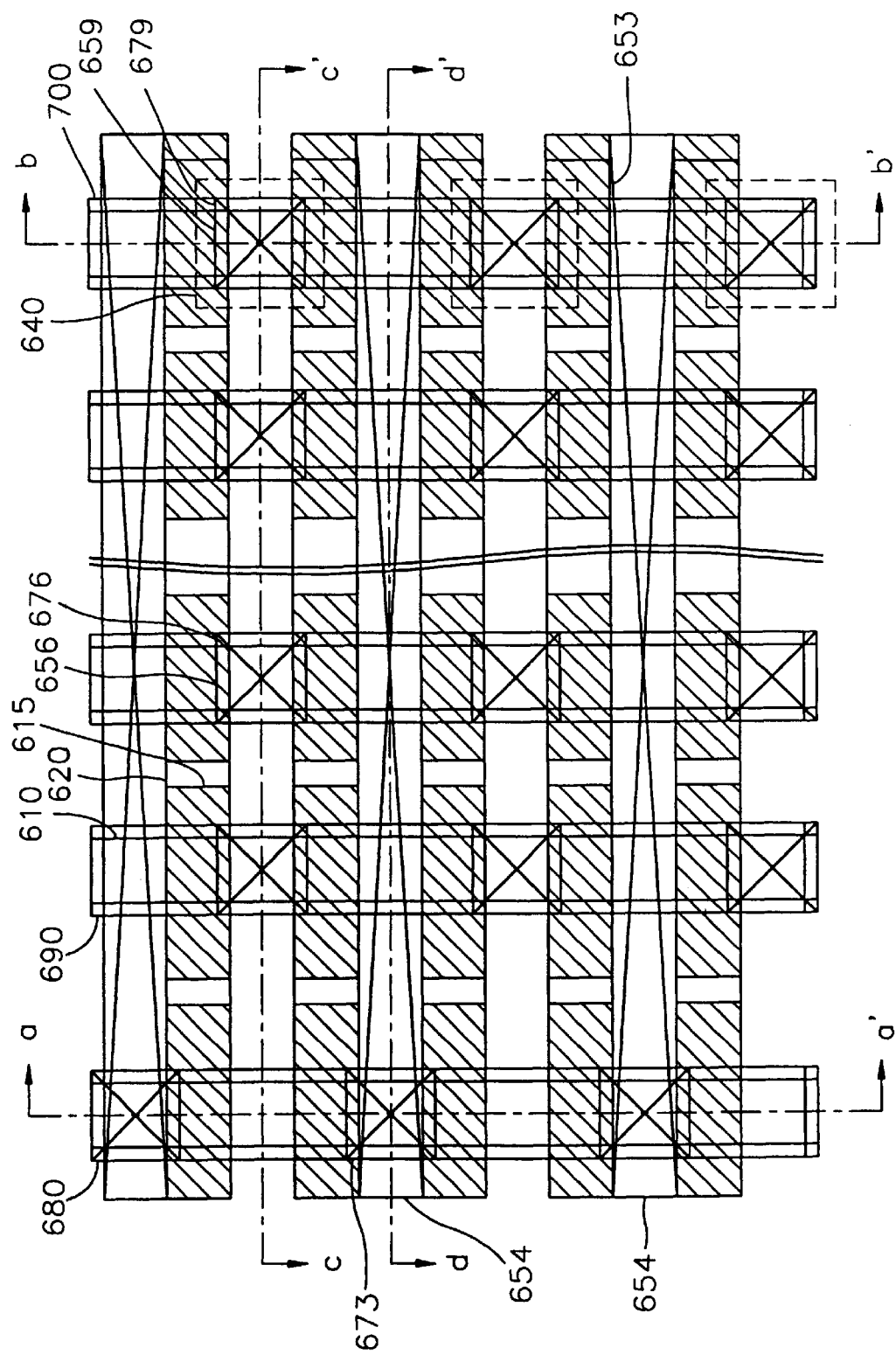
FIG. 15 is a layout view of part of the cell array region of FIG. 13.
Figure 16C:
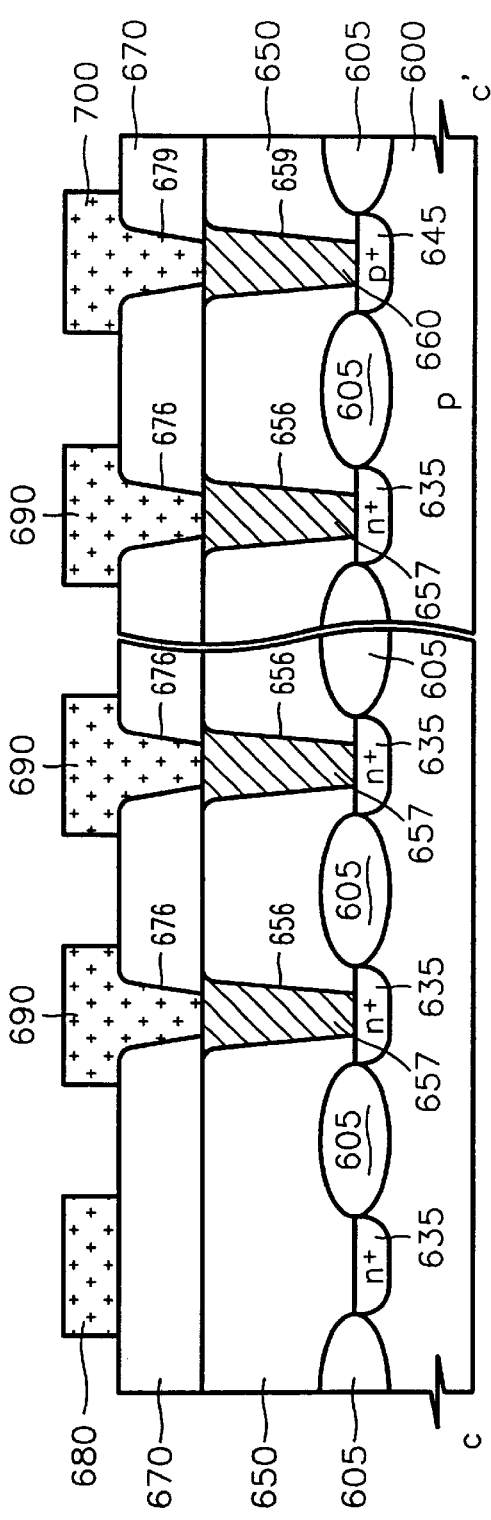
Figure 16D:
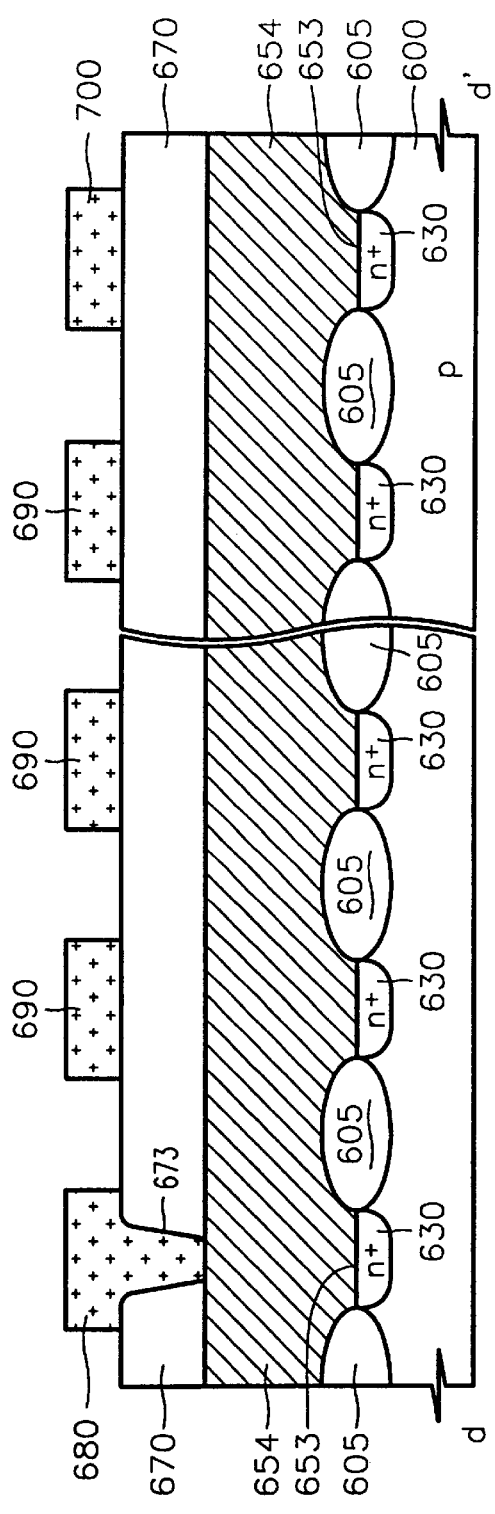

The non-volatile memory device according to a third embodiment of the present invention will now be described in more detail with reference to FIGS. 15 through 16D. FIG. 15 is a layout view of part of the cell array region of FIG. 13. FIGS. 16A, 16B, 16C and 16D are cross-sectional views taken along lines a–a', b–b', c–c', and d–d' of FIG. 15, respectively.

In FIG. 15, reference numeral 610 is an active region pattern, reference numeral 615 is a floating gate pattern, reference numeral 620 is a control gate pattern which functions as a word line, reference numeral 640 is a bulk bias junction pattern, reference numeral 653 is a source line contact hole pattern, reference numeral 654 is a source line pattern, reference numeral 656 is a bit line contact hole pattern, reference numeral 659 is a bulk bias line contact hole pattern, reference numeral 673 is a common source line via pattern, reference numeral 676 is a bit line via pattern, reference numeral 679 is a bulk bias line via pattern, reference numeral 680 is a common source line pattern, reference numeral 690 is a bit line pattern, and reference numeral 700 is a bulk bias line pattern.

Referring to FIG. 15 and FIGS. 16A through 16D, a plurality of active regions 610 are defined by a plurality of isolation regions 605 which are formed within a cell array portion of a semiconductor substrate 600 and extend parallel to each other in one direction. The semiconductor substrate 600 may be a p-type semiconductor substrate itself, a p-type well, or a p-type pocket well formed within an n-type well formed within a p-type semiconductor substrate. Here, only a bulk region where a cell array region is formed is shown.

A plurality of memory cells are arranged in a matrix form on the active region 610. Similar to the first embodiment, each cell comprises a stacked gate 625, and source and drain regions 630 and 635 formed in the active region 610 between adjacent stacked gates 625. The stacked gate 625 has a tunneling dielectric layer 612, a floating gate 615, an inter-gate dielectric layer 617 and a control gate 620. A spacer 627 is formed on each of the sidewalls of the stacked gate 625, but may be omitted as necessary.

Similar to the first embodiment, the floating gate 615 is formed of polycrystalline silicon, and the control gate 620 may be a polycrystalline silicon single layer or a multi-layer including a polycrystalline silicon layer 618 and a silicide layer 619. The control gate 620 functions as a word line.

A bulk bias junction 645 is formed in a portion of the active region 610, preferably, in an active region between two source regions 630 which are adjacent to each other in the direction of the width of the control gate 620 which functions as a word line. The bulk bias junction 645 is a region for applying a bias to a bulk region where a cell array region has been formed. The source and drain regions 630 and 635 are formed of n-type impurities that are opposite to the impurities of the semiconductor substrate 600, and the bulk bias junction 645 is formed of p-type impurities that are the same as the impurities of the semiconductor substrate 600. It is preferable that the bulk bias junction 645 is doped at a higher concentration than the concentration of the semiconductor substrate, that is, a bulk region. It is also preferable that plug ions (not shown) are implanted into the source and drain regions 630 and 635 to prevent increases in contact resistance due to misalignment.

A first interlayer dielectric layer 650 is formed on the entire surface of the resultant structure on which the stacked gates 625 have been formed. A source line contact hole 653, a bit line contact hole 656 and a bulk bias line contact hole 659 are formed within the first interlayer dielectric layer 650. The source line contact hole 653 continuously exposes the source regions 630 and isolation regions 605 of memory cells which are adjacent to each other in the direction of the word line 620. The bit line contact hole 656 exposes the drain regions 635, and the bulk bias line contact hole 659 exposes the bulk bias junction 645. A source line 654, a bit line plug 657 and a bulk bias line plug 660, which are conductive films, are formed within the contact holes 653, 656 and 659. The source line 654 connects the source regions 630 of the memory cells that are adjacent to each other, in the direction of the word line 620.

A second interlayer dielectric layer 670 is formed on the first interlayer dielectric layer 650 in which the source line 654 and the plugs 657 and 660 have been formed. A common source line via 673 for exposing the source line 654, a bit line via 676 for exposing the bit line plug 657, and a bulk bias line via 679 are formed within the second interlayer dielectric layer 670.

A common source line 680 parallel to the bit lines 690 is formed within the common source line via 673 to be electrically connected to the source lines 654. A bit line 690 for connecting the drain regions 635 of the adjacent memory cells via the bit line plug 657 is formed perpendicular to the word line 620, within the bit line via 676. A bulk bias line 700 which intersects the source lines 654, having the second interlayer dielectric layer 679 therebetween, is formed within the bulk bias line via 679 to be electrically connected to the bulk bias junctions 645.

Fourth Embodiment

Figure 17:
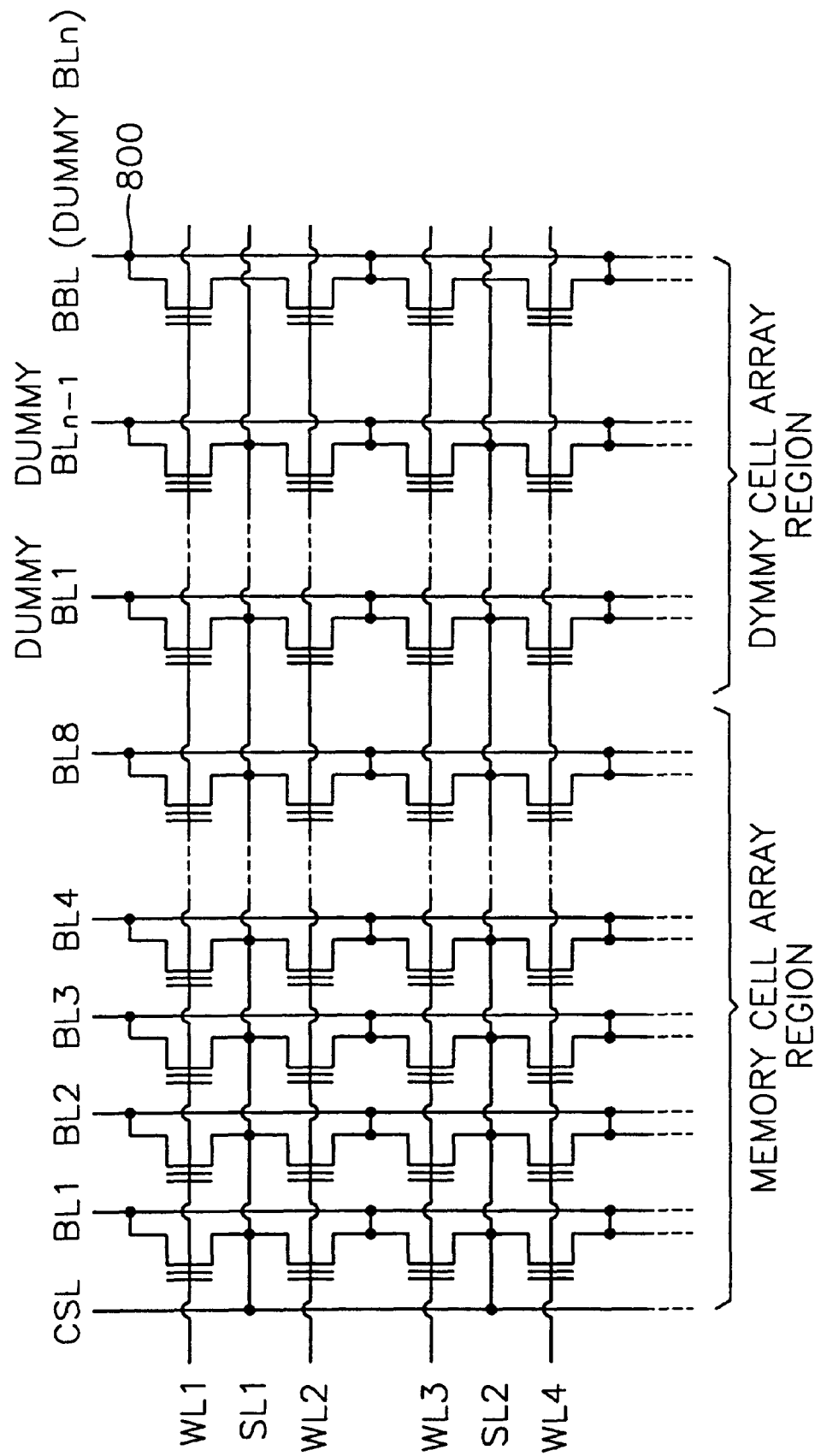
FIG. 17 is an equivalent circuit diagram of a cell array region in a non-volatile memory device according to a fourth embodiment of the present invention.

Referring to FIG. 17, in a non-volatile memory device according to the fourth embodiment of the present invention, a memory cell region and a dummy cell array region are included within a cell array region, and a bulk bias contact structure 800 is included in the dummy cell array region. The dummy cell array region is formed to prevent a loading effect from occurring when a pattern constituting the cell array region is formed. The loading effect is a phenomenon in which the critical value or profile of a cell array pattern in a region where cell array patterns which have been arranged regularly and repeatedly are ended or changed upon photolithography for manufacturing a memory cell, for example, in the edge region of a cell array, becomes different from the critical value or profile of the cell array pattern in the center of the cell array. Generally, this loading effect occurs when active region patterns, gate patterns, or bit line patterns are formed. This degrades the characteristics of cells. To solve this problem, dummy cell array regions that are not used as memory cells are formed in the vicinity of a memory cell array region.

In particular, the bulk bias contact structure 800 in the fourth embodiment is connected to dummy bit lines that constitute a dummy cell array region. That is, the dummy bit line acts as a bulk bias line BBL.

Figure 18:
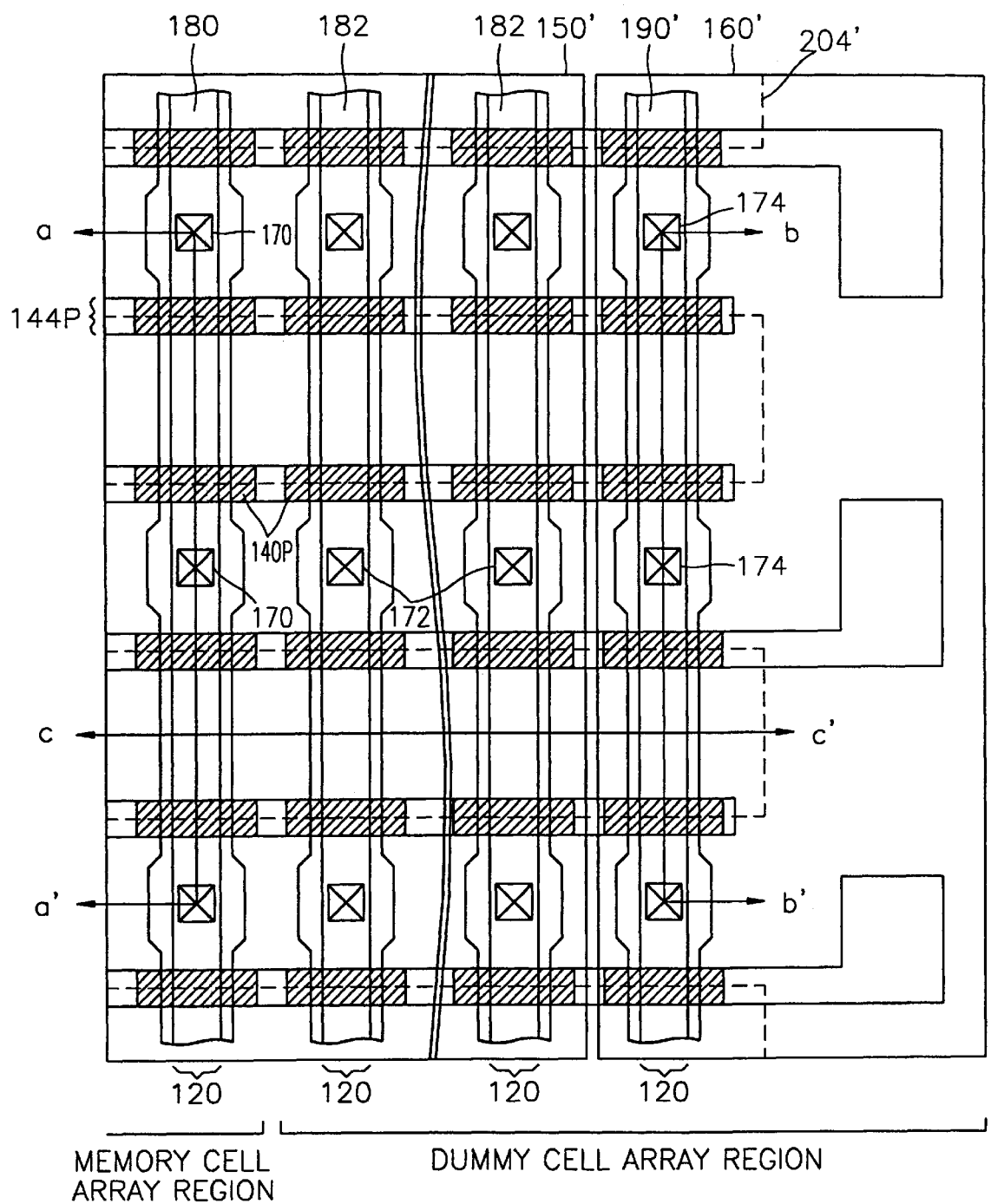
FIG. 18 is a layout view of part of the cell array region of FIG. 17.

The non-volatile memory device according to the fourth embodiment of the present invention will now be described in more detail with reference to FIGS. 18 through 19C. FIG. 18 is a layout view of part of FIG. 17. FIGS. 19A, 19B and 19C are cross-sectional views taken along lines a–a', b–b' and c–c' of FIG. 18, respectively.

In FIG. 18, reference numeral 150' is an ion implantation mask pattern for forming a source region, a drain region and an impurity diffusion region for use as a source line, reference numeral 160' is an ion implantation mask pattern for forming a bulk bias junction, reference numeral 172 is a dummy bit line contact hole pattern, reference numeral 182 is a dummy bit line pattern, reference numeral 190' is a dummy bit line pattern which acts as a bulk bias line, and reference numeral 204' is an etch mask pattern for exposing a region of a semiconductor substrate where the impurity diffusion region for use as a source line is to be formed. The same reference numerals as those of FIG. 9 denote the same patterns as those in the first embodiment.

Figure 19A:
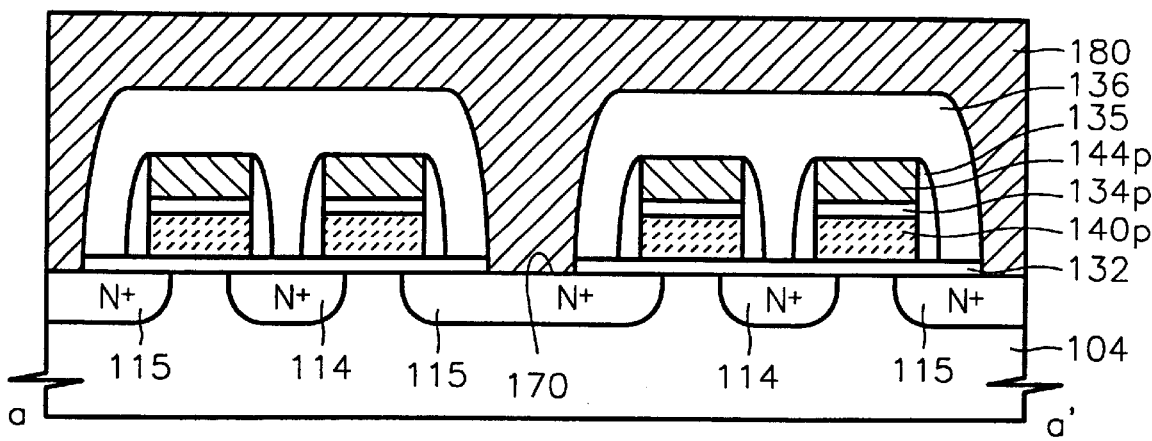
FIGS. 19A, 19B and 19C are cross-sectional views taken along lines a–a', b–b' and c–c' of FIG. 18, respectively.
Figure 19B:
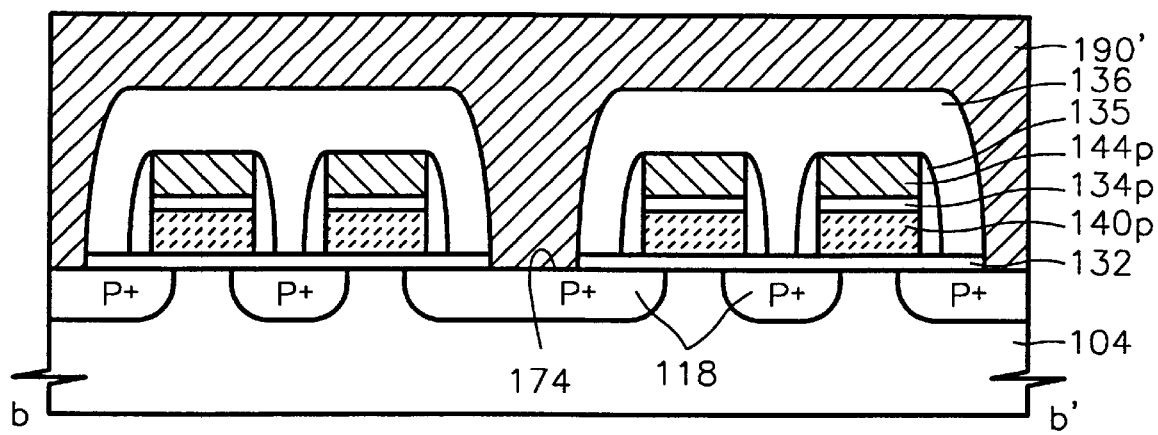

In the non-volatile memory device according to the fourth embodiment, memory cells and bit lines in the memory cell array region are formed in the same method as the first embodiment, as shown in FIG. 19A. However, in the fourth embodiment, a dummy cell array region is further included in the non-volatile memory device. Also, the fourth embodiment is different from the first embodiment in which the common source line 190 of FIG. 10B acts as a bulk bias line, in that the dummy bit line 190' is coupled to the bulk bias junction 118 formed within the p-type pocket well 104 in a substrate and thus acts as a bulk bias line. The bulk bias junction 118 is doped with impurities having the same conductivity type as that of the bulk region 104 where the cell array region is formed. FIG. 19B shows a structure in which a bulk bias line is formed by connecting the dummy bit line 190' to bulk bias junctions 118 formed in the drain regions of a dummy cell which pertains to the dummy bit line 190'. Undoubtedly, the bulk bias junction 118 can also be formed in the source regions of the dummy cell which pertains to the dummy bit line 190', or can be formed in both the source region and the drain region. Thus, the bulk bias line 190' can also be connected to the bulk bias junction formed in the source region or in both the source and drain regions.

Figure 19C:
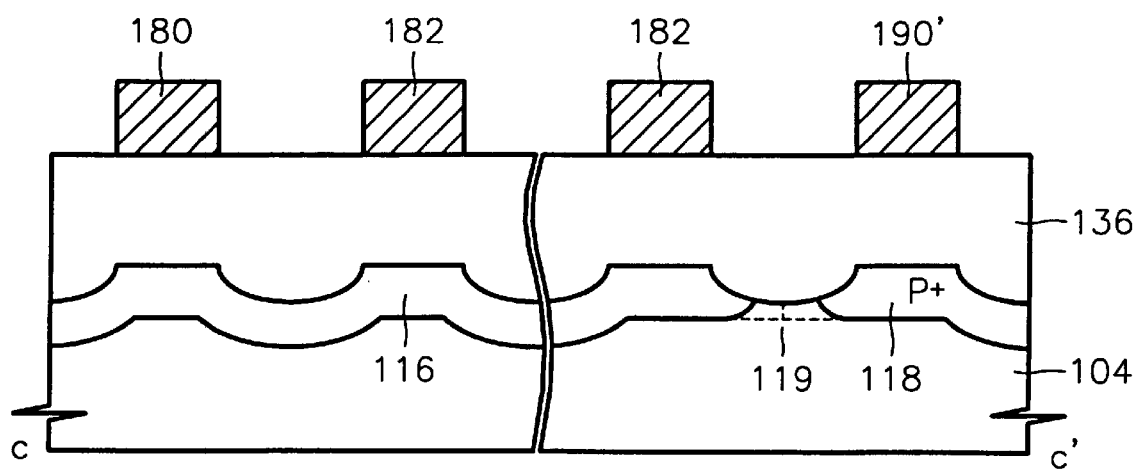

Also, it is preferable that a source line 116 for connecting adjacent source regions 114 in the direction of a word line 144P, and a bulk bias junction 118 are isolated from each other by a predetermined distance, as shown in FIG. 19C. This can be achieved by isolating the ion implantation mask pattern 150' (see FIG. 18) for forming a source region, a drain region and an impurity diffusion region for use as a source line from the ion implantation mask pattern 160' (see FIG. 18) for forming a bulk bias junction, at a predetermined distance. The isolation of the source line 116 from the bulk bias contact junction 118 can prevent malfunction of the device which may be caused when different voltages are applied to the source line 116 and the bulk bias line 190'. If there is no problem in operating the device, the source line 116 can be connected to the bulk bias junction 118 as indicated by a dotted line 119.

As a modification of the non-volatile memory device according to the fourth embodiment, a dummy bit line is used as a bulk bias line as in the second and third embodiments, and a source line may be formed of a conductive film pattern instead of an impurity diffusion region. It is preferable that the conductive film pattern intersects the bulk bias junction while being insulated from the bulk bias junction. This modified non-volatile memory device is not shown since it can be easily understood from the first through fourth embodiments.

Figure 20A:
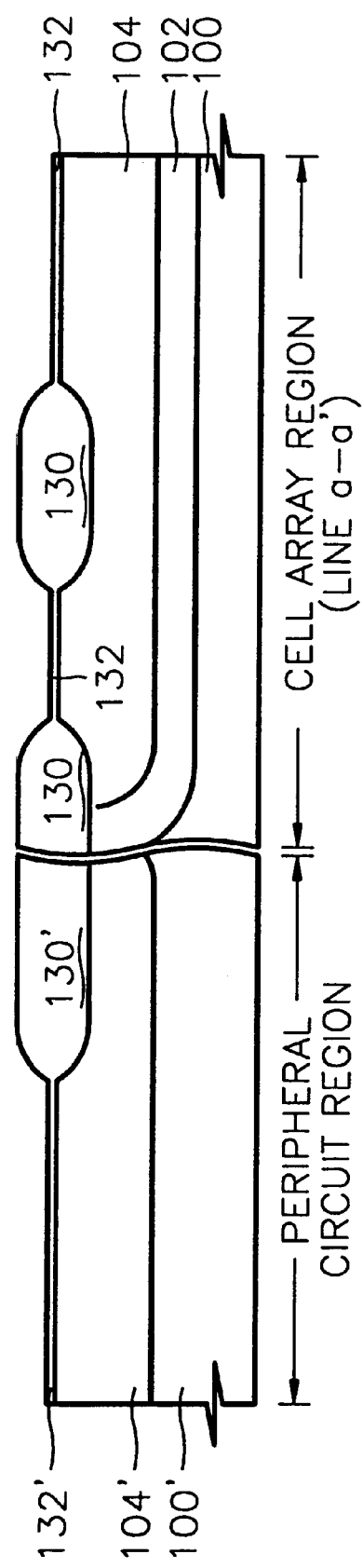

Method of Fabricating Non-volatile Memory Devices According to the First Embodiment FIGS. 20A through 28B are cross-sectional views illustrating a method of fabricating a non-volatile memory device according to a first embodiment of the present invention. In FIGS. 20A, 21A, . . . , 28A, the right side shows a cross-sectional view of a cell array region taken along line a–a' of FIG. 9, and the left side shows a cross-sectional view of a peripheral circuit region in the same process step for forming the cell array region. FIGS. 20B, 21B, . . . , 28B are cross-sectional views taken along line b–b' of FIG. 9.

Figure 20B:
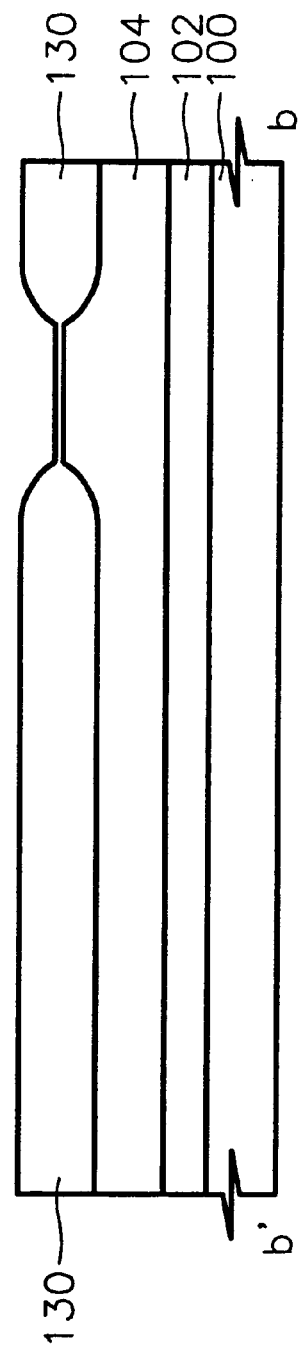

Referring to FIGS. 20A and 20B, first, semiconductor substrates 100 and 100' are prepared. Then, a bulk region intended to be a cell array region, and a bulk region intended to be a peripheral circuit region are defined in the semiconductor substrates 100 and 100'. The bulk regions are defined by forming necessary wells 102, 104 and 104'. In the cell array region, an n-type well 102 is formed within the P-type substrates 100, and a P-type pocket well 104 is formed within the n-type well 102. In the peripheral circuit region, an n-type well, a p-type well 104', and a pocket p-type well are formed as necessary. Next, isolation films 130 and 130' are formed to a thickness of about 4000 Å using a conventional isolation technique such as local oxidation of silicon (LOCOS) or a poly buffered LOCOS (PBL). In the cell array region, a plurality of isolation films 130 that are parallel to each other are formed in accordance with the layout of FIG. 9. Here, the isolation film is formed so that it completely covers the region in which the common source line 190 of FIG. 11 is to be formed. Simultaneously, the isolation film 130' is formed in the peripheral circuit region as necessary. Thereafter, dielectric films 132 and 132' are formed over the resulting structure. When the dielectric films are used as tunneling films, they are grown to a thickness of about 80 to 120 Å. If the non-volatile memory device according to the present invention is not an electrically erasable and programmable ROM (EEPROM) but an electrically programmable ROM (EPROM), the dielectric layers are formed to thicknesses of 200 Å. In this case, the dielectric layers act as gate dielectric layers. The dielectric layers are generally oxide films. After the dielectric layers 132 and 132' are formed, impurities for controlling the threshold voltage of a cell, for example, P-type impurities, are implanted at a concentration of $1.5 \times 10^{13}$ to $2.5 \times 10^{13}$ ions/cm$^2$ only into the cell array region, as necessary.

Referring to FIGS. 21A and 21B, a first conductive film for forming a floating gate is formed. The first conductive film is formed of polycrystalline silicon, and is doped with impurities to increase its conductivity. The impurity doping can be performed by conventional techniques such as phosphorus oxychloride (POCl$_3$) deposition or ion implantation. Then, the first conductive film is patterned to form a first conductive layer pattern 140. The first conductive layer pattern 140 is not formed in a region where a common source line is to be formed. A first conductive layer pattern 140' remains in the peripheral circuit region or is removed from the peripheral circuit region, as necessary. Then, intergate dielectric layers 134 and 134' are formed on the entire surface of the resultant structure on which the first conductive layer patterns 140 and 140' have been formed. It is preferable that each of the intergate dielectric layers 134 and 134' is an ONO layer obtained by sequentially forming an oxide layer, a nitride layer and an oxide layer to thicknesses of 50–90 Å, 80–120 Å and 50–60 Å, respectively. The total thickness of the ONO layer is set to be calculated at about 130 to 200 Å in terms of an oxide layer.

As shown in FIGS. 22A and 22B, in order to form a transistor in the peripheral circuit region, the cell array region is protected by a mask pattern 201, and the intergate dielectric layer 134', the first conductive layer pattern 140', and the dielectric layer 132' are removed from the peripheral circuit region. The mask pattern 201 is formed of photoresist. At this time, if the first conductive layer pattern 140' has been removed from the peripheral circuit region in the step shown in FIG. 21A, only the intergate dielectric layer 134' and the dielectric layer 132' are removed.

Referring to FIGS. 23A and 23B, the mask pattern 201 of FIGS. 22A and 22B, is removed, a gate dielectric layer 133' is grown on the exposed substrate 104' in the peripheral circuit region, conductive layers 144 and 144' for forming control gates are deposited on the entire surface of the resultant structure, and dielectric layers 135 and 135' for forming masks are then deposited on the second conductive layers 144 and 144', respectively. Each of the conductive layers 144 and 144' is a single polycrystalline silicon layer or a double layer including a polycrystalline silicon layer and a metal silicide layer such as tungsten silicide, titanium silicide or tantalum silicide. The dielectric layers 135 and 135' for forming masks are formed to a thickness of about 3000 to 5000 Å. The dielectric layers 135 and 135' can be an oxide layer, a nitride layer, a combination of an oxide layer and a nitride layer, or a combination of an oxide layer and a polycrystalline silicon layer. The functions of the dielectric layers 135 and 135' for forming masks will be described later.

As shown in FIGS. 24A and 24B, dielectric layer patterns 135P and 135'P are formed using the etch mask patterns 202 and 202', and then a control gate 144P is formed in the cell array region, and a gate 144'P of a transistor is formed in the peripheral circuit region as necessary. As shown in FIGS. 24A and 24B, this process can be performed by continuously etching the mask dielectric layers 135 and 135' and the conductive layers 144 and 144' using the etch mask patterns 202 and 202'. Alternatively, this process can be performed in two steps: 1) forming the mask dielectric layer patterns 135P and 135'P for defining a control gate, by etching only the mask dielectric layers 135 and 135' using the etch mask patterns 202 and 202'; and 2) removing the etch mask patterns 202 and 202' and forming the control gate 144P and the gate 144'P of a peripheral circuit transistor by etching the conductive layers 144 and 144' using the mask dielectric layer patterns 135 P and 135'P as etch masks. The reason why the control gate 144P and the gate 144'P of the peripheral circuit transistor are formed by the above two steps is that when each of the second conductive layers 144 and 144' is a double layer including a polycrystalline silicon layer and a metal silicide layer, thick etch mask patterns 202 and 202', for example, thick photoresist patterns, must be formed to etch the thick double layer. When thick photoresist patterns 202 and 202' are used for the above reason, an etch gas is not uniformly supplied to a region where patterns are dense, thus degrading the uniformity of etching. Thus, when the thick photoresist patterns 202 and 202' are removed, and then the conductive layers 144 and 144' are etched using only the dielectric layer patterns 135P and 135'P as masks, a non-uniform etching problem can be solved. The mask dielectric layer patterns 135P and 135'P also protect the control gate 144P in a subsequent process for etching an isolation layer 130 between the source regions of cells that are adjacent to each other in the lengthwise direction of the control gate 144P.

Figure 25A:
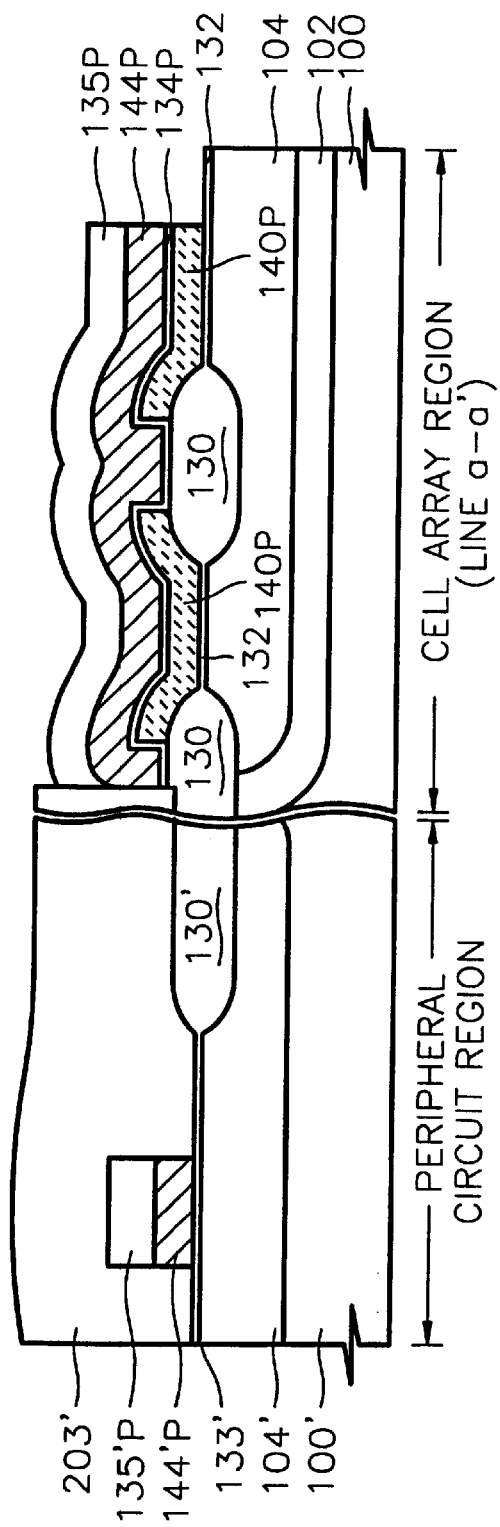
Figure 25B:
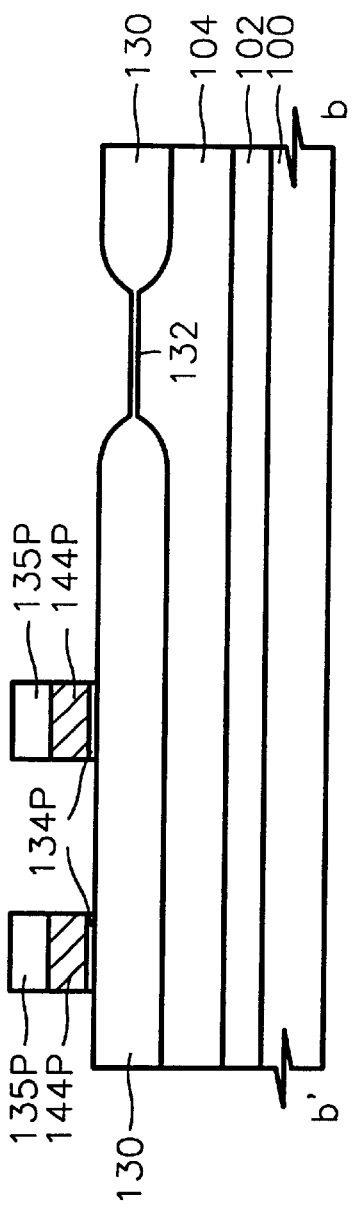

Referring to FIGS. 25A and 25B, the peripheral circuit region is protected by a mask pattern 203. The intergate dielectric layer 134 and the first conductive layer pattern 140 are etched using the mask dielectric layer pattern 135P and the control gate 144P which are formed in the cell array region, as masks, thereby forming a stacked gate including a floating gate 140P, the intergate dielectric layer pattern 134P and the control gate 144P. At this time, stacked gate structures obtained by sequentially forming the intergate dielectric layer pattern 134P, the control gate 144P, and the mask dielectric layer pattern 135P are also formed on the isolation layer 130 on which a common source line is to be formed. Here, n-type impurities for use as a lightly doped drain (LDD) can be implanted into the substrate using the control gate 144P and the gate 144'P of a peripheral circuit transistor as masks.

Figure 26A:
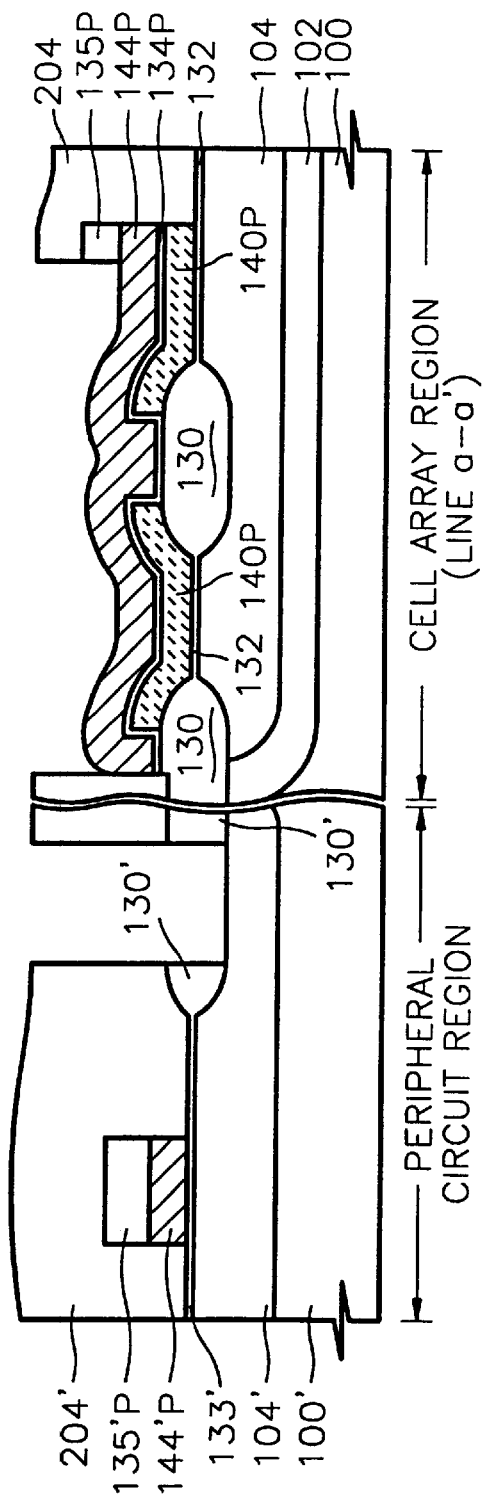
Figure 26B:
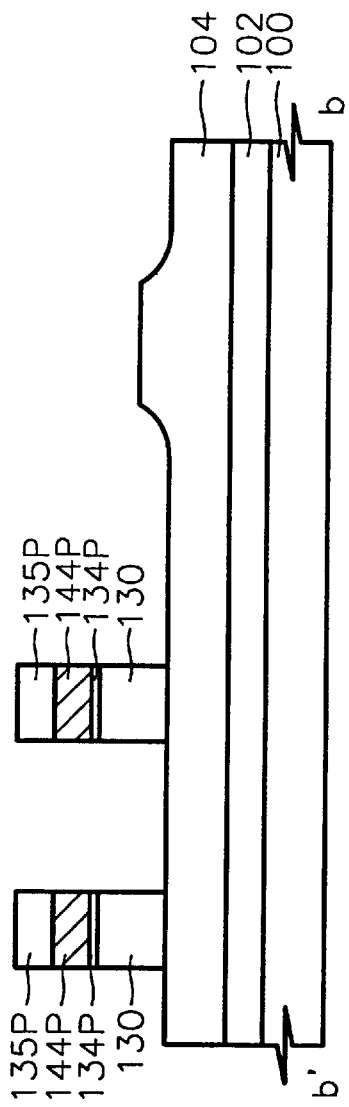

Referring to FIGS. 26A and 26B, an etch mask pattern 204 for exposing a portion of a semiconductor substrate on which an impurity diffusion region for use as a source line and a bulk bias region are to be formed, exposes the isolation layer 130 where a source line and a bulk bias contact junction are to be formed, while covering the drain region of the cell array region and part of the control gate 144P. Simultaneously, a mask pattern 204' exposes part of the isolation layer 130' in the peripheral circuit region.

When the isolation layers 130 and 130' are etched using the mask patterns 204 and 204', respectively, they are self aligned by the control gate 144P and the mask dielectric layer pattern 135P formed on the control gate 144P, in the cell array region. Accordingly, the isolation layer 130 between the source regions of cells which are adjacent to each other in the lengthwise direction of the control gate 144P is removed, so that a region in which a source line is to be formed, and a region in which a bias contact junction is to be formed are exposed. At this time, the mask dielectric layer pattern 135P stacked on the control gate 144P prevents the control gate 144P from being damaged during etching of the isolation layer 130. As shown in FIG. 26A, part of the isolation layer 130' in the peripheral circuit region is also removed, so that a region in which a bulk bias junction for a peripheral circuit is to be formed is exposed. A process for forming a spacer (not shown) on the sidewalls of the stacked gate may be further performed before or after the isolation layers 130 and 130' are etched. Preferably, the spacer is formed before the isolation layers 130 and 130' are etched.

Referring to FIGS. 27A and 27B, the mask patterns 204 and 204', which are used to form an impurity diffusion region for use as a source line and a bulk bias junction, are removed. Ions for forming a source region, a drain region and the impurity diffusion region for use as a source line, and ions for forming the bulk bias junction are implanted in two steps. First, an N-type ion implantation mask pattern (not shown) is formed on the substrate 100 and 100' using the ion implantation mask pattern 150 of FIG. 9 which defines a region in which the source and drain regions and the source line impurity diffusion region are to be formed, in the cell array region, together with the source and drain regions of an NMOS transistor and a region in which an N$^+$ guard band is to be formed, in the peripheral circuit region. Thereafter, N$^+$ impurities, e.g., arsenic (As) or phosphorous (P), are implanted as indicated by dotted lines 108 and 108'. After the N-type ion implantation mask pattern is removed, a P-type ion implantation mask pattern is formed using the pattern 160 of FIG. 9 for defining a region in which the bulk bias junction is to be formed, in the cell array region, and defining the source and drain regions of a PMOS transistor and the region in which a P$^+$ guard band is to be formed, in the peripheral circuit region. Thereafter, P$^+$ impurities, e.g., boron (B) or boron difluoride (BF$_2$), are implanted as indicated by a dotted line 110.

In FIG. 27A, the conductivity type, n$^+$, of impurities implanted into a region in the peripheral circuit region from which the isolation layer 130' has been removed is opposite to the conductivity type of the P well 104' below the implanted impurities, but can be changed depending on the purpose of a bulk bias contact for a peripheral circuit to be formed at this portion. That is, if the bulk bias contact to be formed at this portion is a guard band contact for preventing latch up or an electrostatic discharge prevention contact, impurities having a conductivity type that is opposite to the conductivity type of the P well 104' are ion-implanted as shown in FIG. 27A. If the bulk bias contact is a guard band bulk bias contact for isolation, impurities having the same conductivity type as that of the P well 104' can be ion-implanted.

Figure 28A:
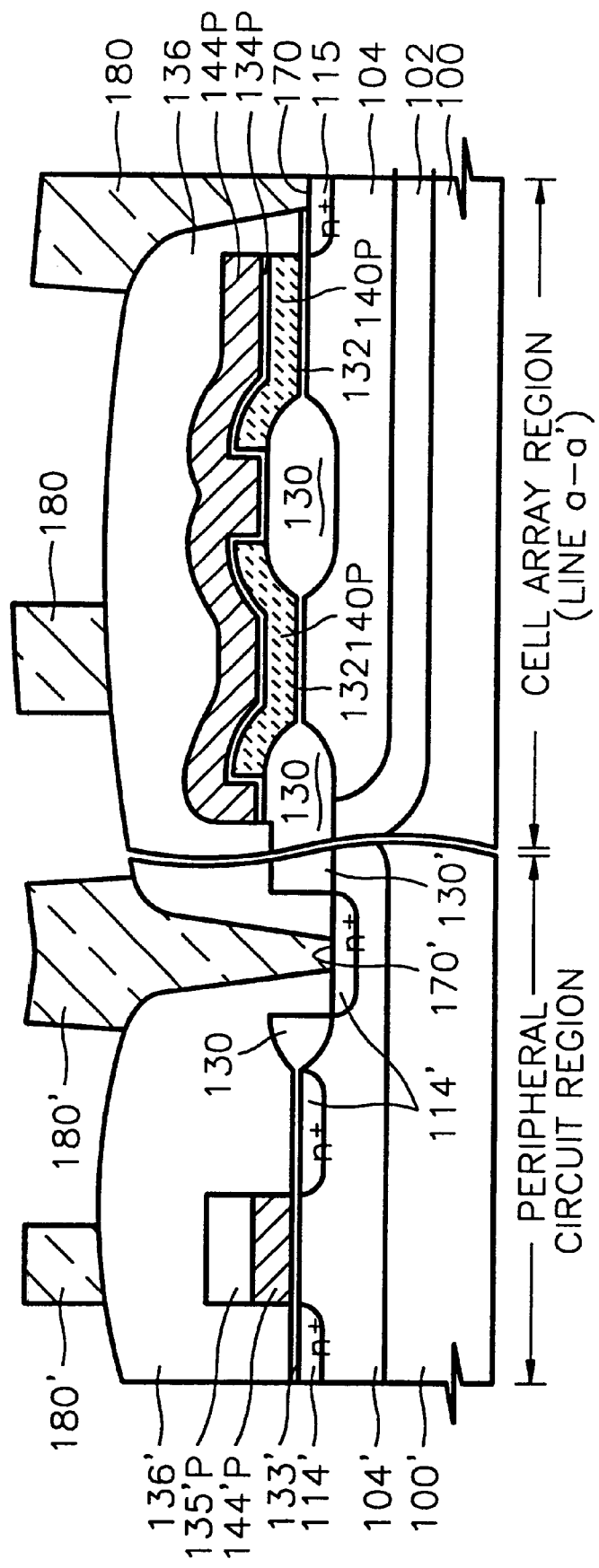
Figure 28B:
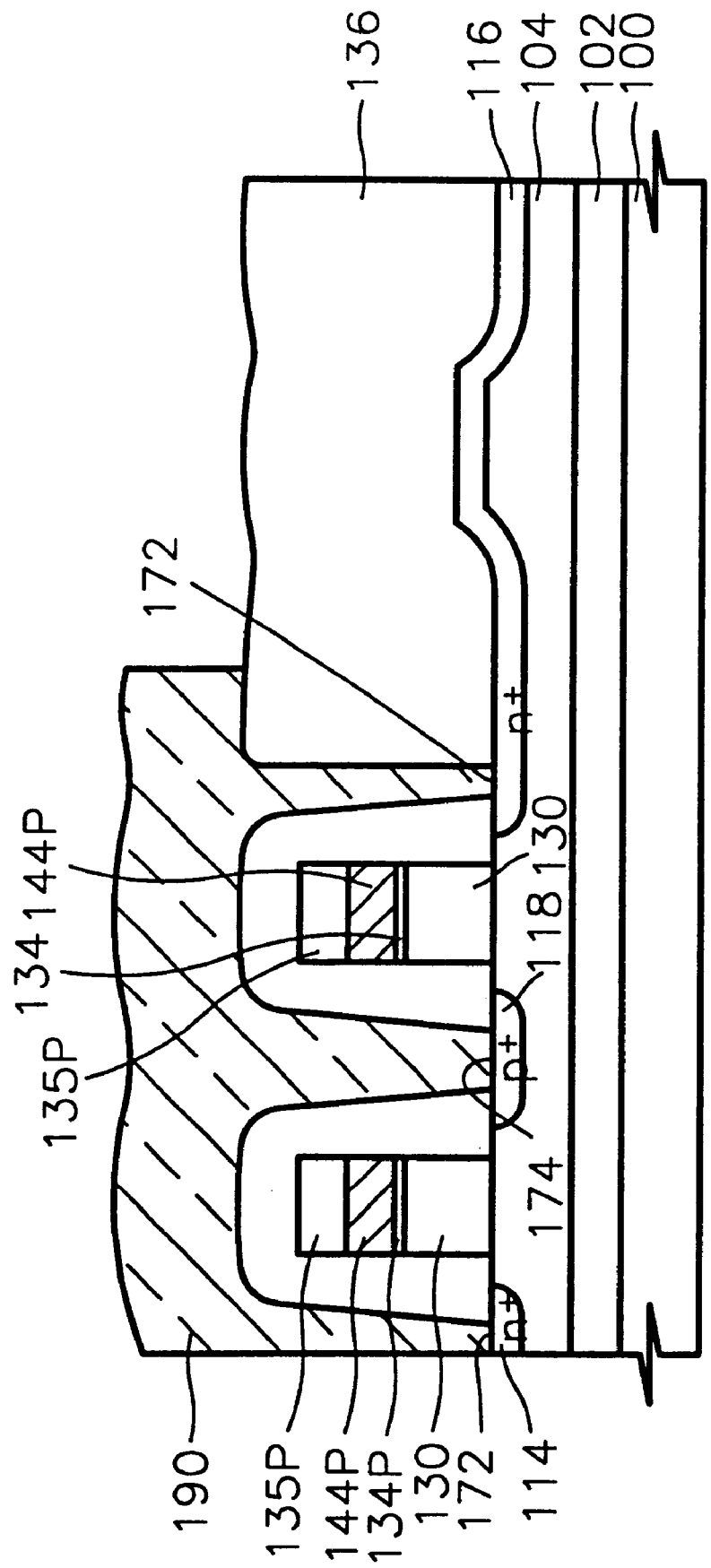
Figure 31A:
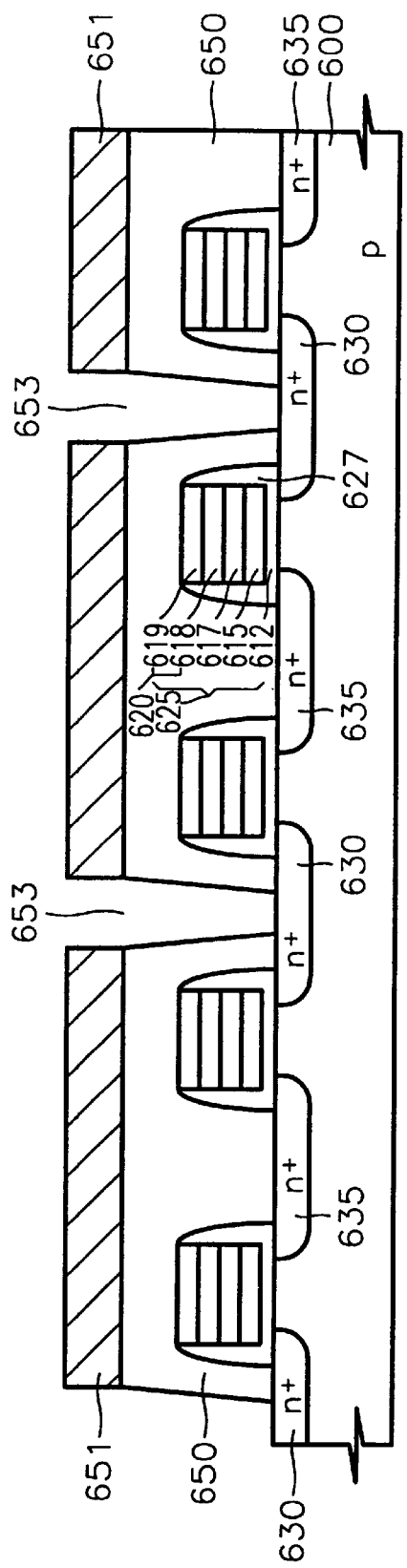
Figure 31B:
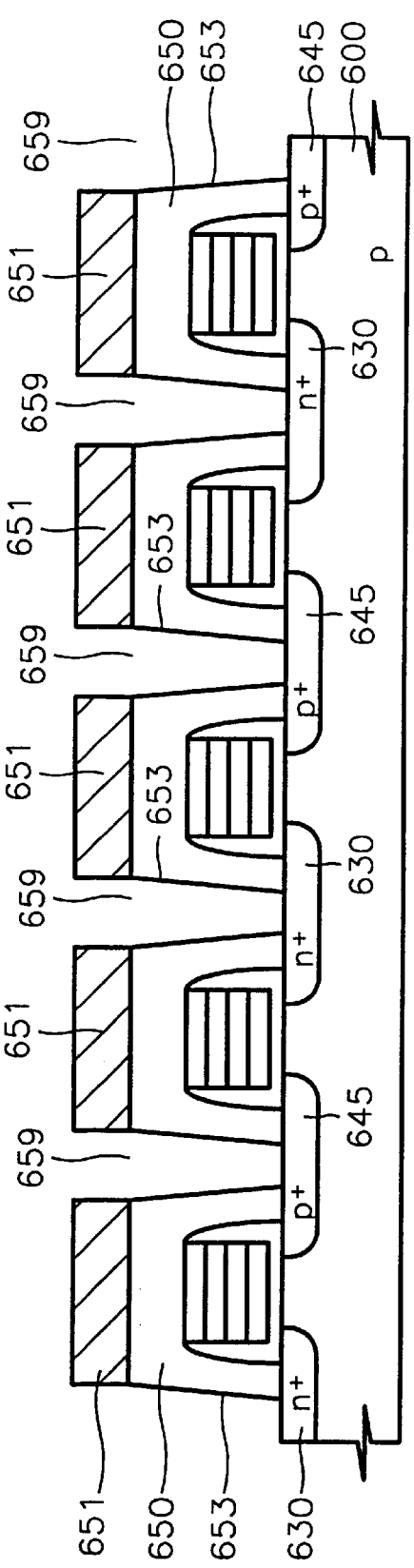

As shown in FIGS. 28A and 28B, a high temperature oxide layer and a boron phosphorus silicate glass (BPSG) layer are deposited to 1000 Å and 5000 Å, respectively, on the entire surface as interlayer dielectric layers 136 and 136', after ion implantation. The high temperature oxide layer and the BPSG layer are reflowed at about 900° C., so that they are planarized. Then, the interlayer dielectric layer 136 is etched to form a bit line contact hole 170, a common source line contact hole 172, and a bulk bias line contact hole 174 in the cell array region and a contact hole 170' for exposing the bulk bias junction for a peripheral circuit. Next, a conductive layer of metal or metal silicide is deposited and etched, thereby completing formation of a bit line 180 which is electrically connected to the drain region 115, a common source line and bulk bias line 190 which are connected to the source line 114 and the bulk bias junction 118 simultaneously, and a wiring 180' of the peripheral circuit region.

Method of Fabricating Non-volatile Memory Devices According to the Third Embodiment FIGS. 29A through 33D are cross-sectional views illustrating a method of fabricating a non-volatile memory device according to a third embodiment of the present invention.

Referring to FIGS. 29A through 29D, a bulk region intended to be a cell array region, and a bulk region intended to be a peripheral circuit region are defined in a substrate 600, an active region is defined by forming an isolation layer 605, and a stacked gate 625 is formed on the active region, in the same method as the method for fabricating non-volatile memory devices according to the first embodiment. Here, the stacked gate 625 includes a tunneling oxide layer 612, a floating gate 615, an intergate dielectric layer 617, and a control gate 620 that may be a double layer including a polycrystalline silicon layer 618 and a silicide layer 619. This method is different from the method of fabricating non-volatile memory devices according to the first embodiment only in that a region in which the common source line 700 of FIG. 15 is not defined on the isolation layer but instead is defined on the active region 610 of FIG. 15. Then, an oxide layer, a nitride layer and a polycrystalline silicon layer are formed on the entire surface of the resultant structure on which the stacked gate 625 has been formed, and then etched, thereby forming a spacer 627 on the sidewalls of the stacked gate 625.

Thereafter, mask patterns 629 for forming source and drain regions are formed on the resultant structure on which the stacked gates 625 have been formed. Here, the mask pattern 629 is formed by depositing and patterning photoresist. Then, a source region 630 and a drain region 635 are formed by implanting n-type impurities using the mask pattern 629 as an ion implantation mask. Consequently, a plurality of memory cells are arranged in a matrix form on the substrate 600.

Referring to FIGS. 30A through 30D, the ion implantation mask pattern 629 for forming the source/drain regions 630/635 is removed, and then an ion implantation mask pattern 640 for defining the bulk bias junction region shown in FIG. 15 is formed. The mask pattern 640 exposes active regions between two source regions 630 which are adjacent to each other in the direction of the width of the control gate 620. Then, a plurality of bulk bias junctions 645 are formed by ion implanting p-type impurities using the mask pattern 640 as an ion implantation mask.

Referring to FIGS. 31A through 31D, the ion implantation mask pattern 640 which defines the bulk bias junction 645 is removed, and then a first interlayer dielectric layer 650 is formed on the entire surface of the substrate 600. Specifically, initially, a high temperature oxide layer and a BPSG layer are sequentially deposited on the entire surface of the substrate 600 to 500–1000 Å and 4000–6000 Å, respectively. Next, the BPSG layer is reflowed for 10 to 20 minutes at 850 to 900° C., for planarization, thereby forming the first interlayer dielectric layer 650.

Thereafter, a mask pattern 651 for defining a source line contact hole, a bit line contact hole, and a bulk bias line contact hole is formed on the first interlayer dielectric layer 650. The mask pattern 651 is formed by coating the first interlayer dielectric layer 650 with photoresist and patterning the formed photoresist layer. Then, the first interlayer dielectric layer 650 is etched using the mask pattern 651 as an etch mask, thereby forming source line contact holes 653 for continuously exposing the source regions 630 and the isolation layers 605 in the lengthwise direction of a control gate, that is, the word line 620, bit line contact holes 656 for exposing the drain regions 635, and bulk bias line contact holes 659 for exposing the bulk bias junction lines 645.

Figure 32A:
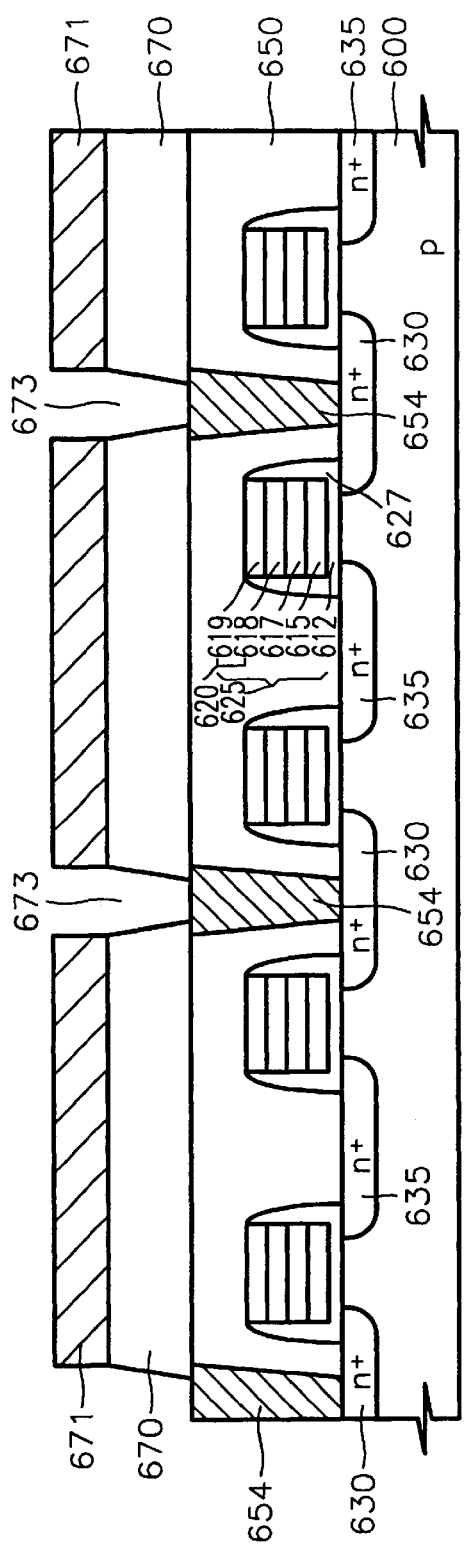
Figure 32B:
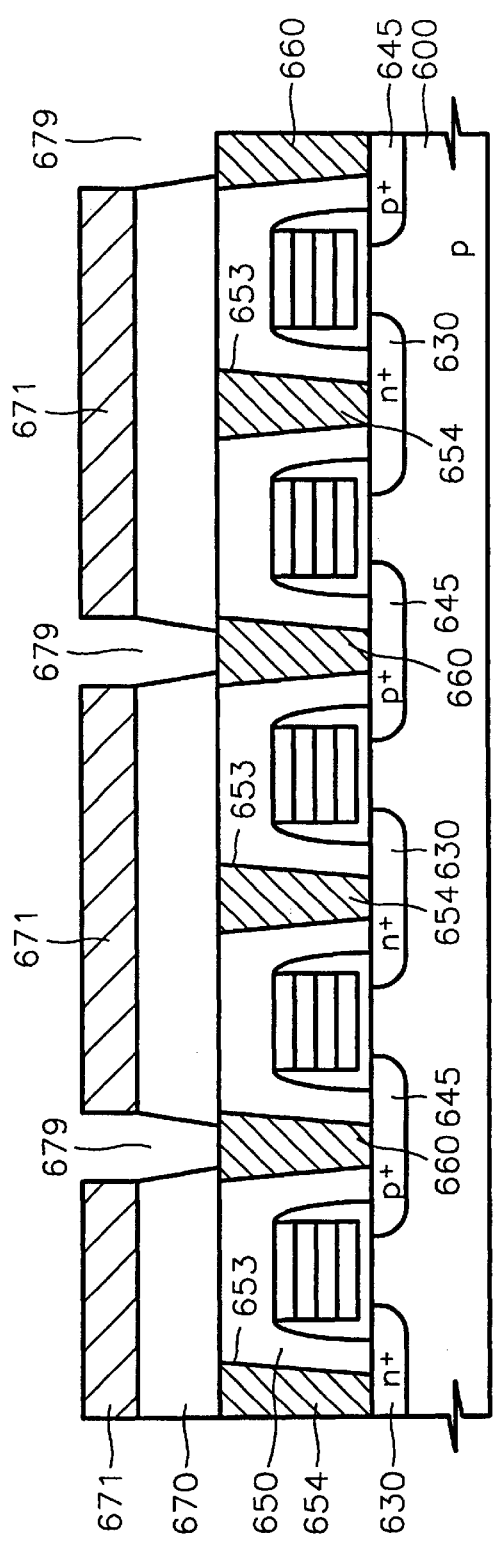
Figure 32C:
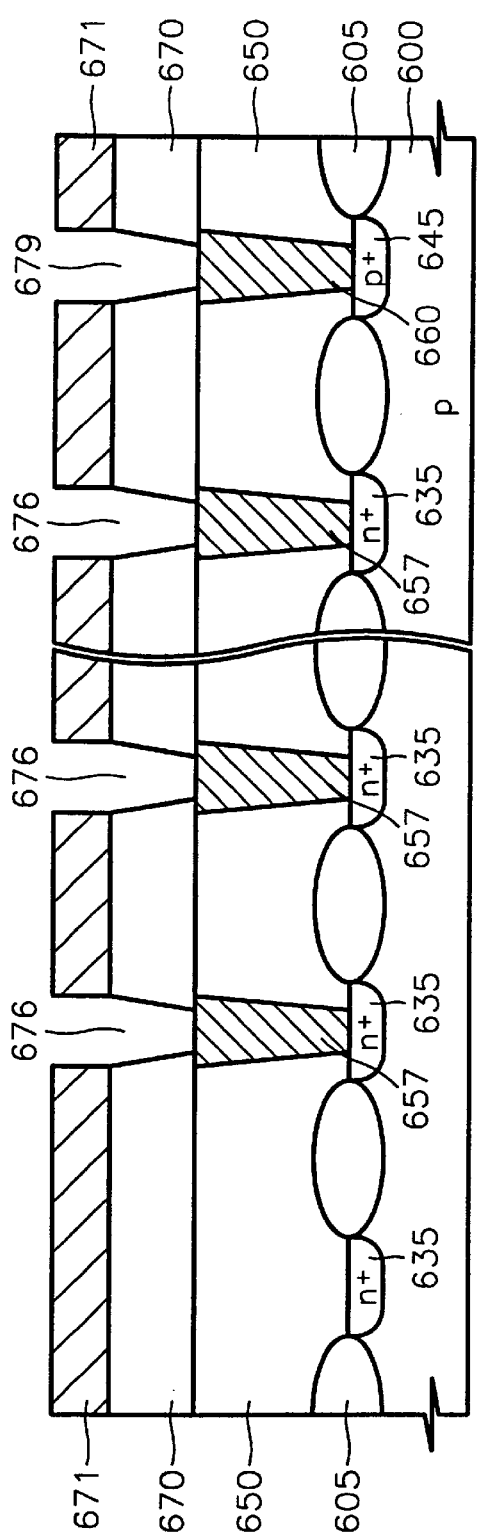
Figure 32D:
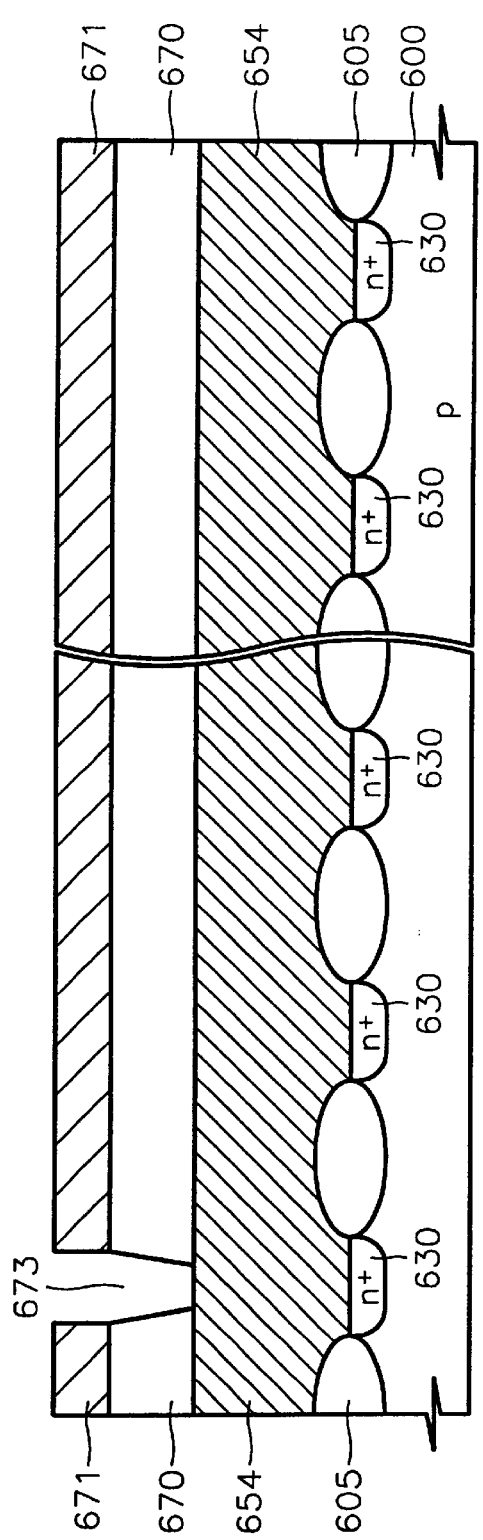
Figure 33C:
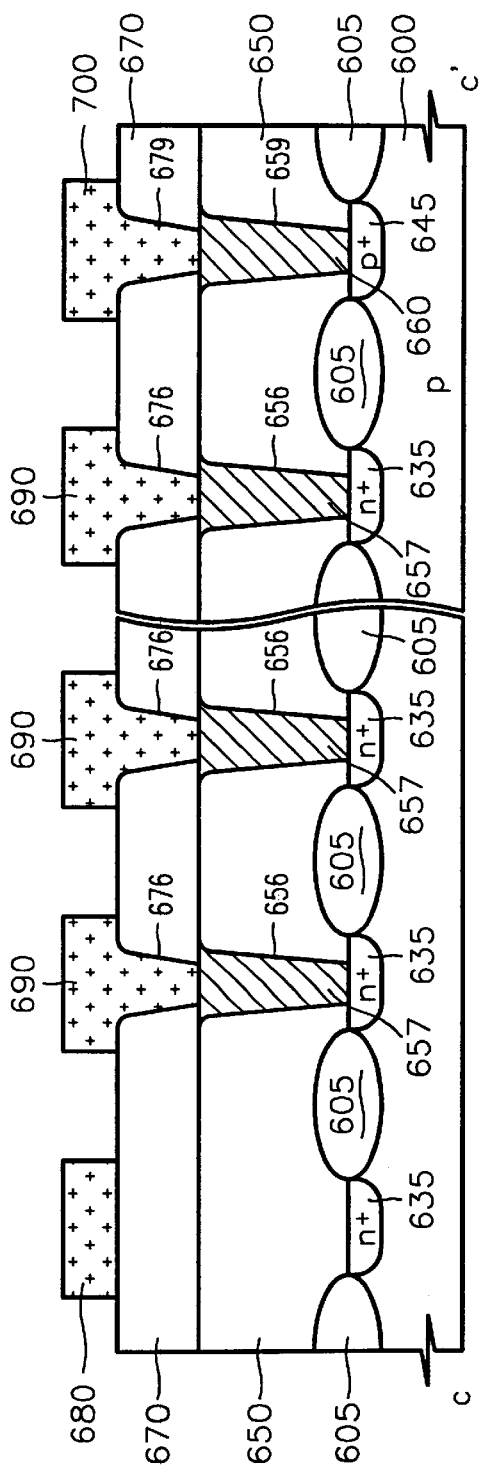
Figure 33D:
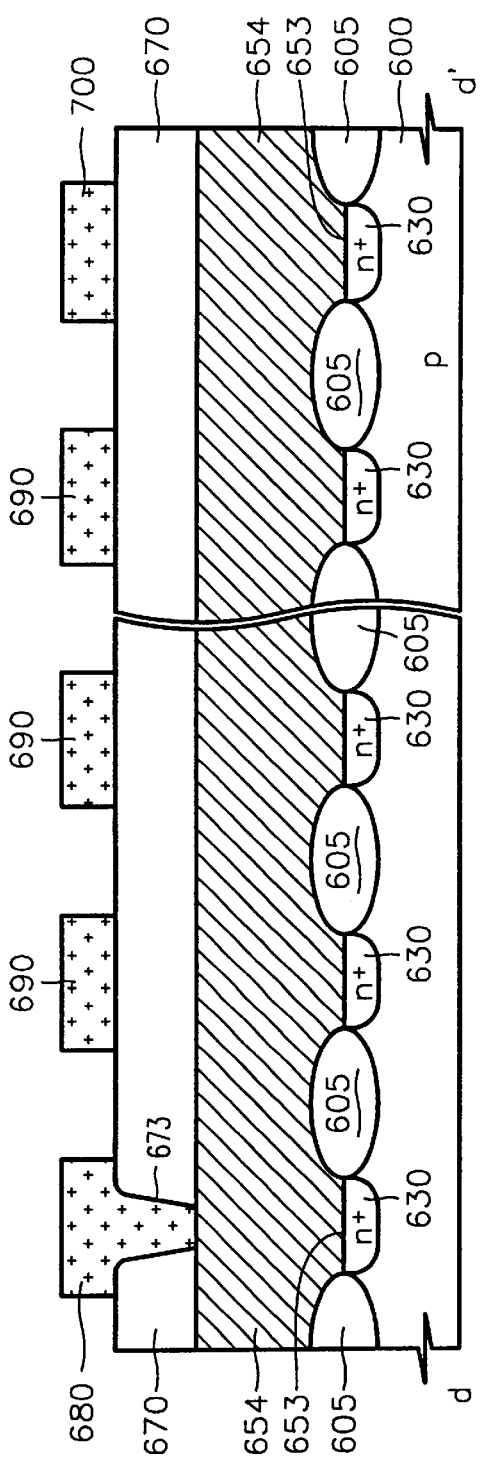

Referring to FIGS. 32A through 32D, the mask pattern 651 which defines the contact holes 653, 656 and 659 is removed, and then a first conductive layer for filling the contact holes 653, 656, and 659 is formed. The first conductive layer is formed of a conductive material such as metal, metal silicide or polycrystalline silicon, preferably, of a low resistance conductive material such as tungsten. Thereafter, the first conductive layer is polished by etching back or chemical mechanical polishing, and thus a source line 654, a bit line plug 657, and a bulk bias line plug 660 are formed within the source line contact hole 653, the bit line contact hole 656, and the bulk bias line contact hole 659, respectively. Accordingly, as shown in FIG. 32D, the source line 654 is electrically connected to the source regions 630 of cells that are adjacent to each other in the direction of the word line 620.

Thereafter, a second interlayer dielectric layer 670 is formed on the entire surface of the resultant structure on which the source lines 654, the bit line plugs 657 and the bulk bias line plugs 660 have been formed. Then, a via hole formation mask pattern 671 is formed on the second interlayer dielectric layer 670 by coating the second interlayer dielectric layer 670 with photoresist and patterning the formed photoresist layer. The second interlayer dielectric layer 670 is etched using the via hole formation mask pattern 671, thereby forming a plurality of common source line via holes 673 for exposing the source lines 654, a plurality of bit line via holes 676 for exposing the bit line plugs 657, and a plurality of bulk bias line via holes 679 for exposing the bulk bias line plugs 660.

Referring to FIGS. 33A through 33D, the via hole formation mask pattern 671 is removed, and a second conductive layer which fills the via holes 673, 676 and 679 is formed to a predetermined thickness on the second interlayer dielectric layer 670. The second conductive layer can be formed of metal, metal silicide or polycide. Then, the second conductive layer is patterned, thereby completing formation of a plurality of common source lines 680 for connecting the source lines 654 to each other, a plurality of bit lines 690 for connecting the drain regions that are adjacent to each other in a direction perpendicular to the word line 620, and a plurality of bulk bias lines 700 which connect the bulk bias junctions 645 formed within the active regions to each other to intersect the source lines 654.

Method of Fabricating Non-volatile Memory Device According to the Fourth Embodiment This method is almost the same as the method of fabricating non-volatile memory devices according to the first embodiment, except that a common source line is formed on an active region within a cell array region, a dummy cell array region is further formed in the vicinity of the cell array region to reduce the loading effect, and a dummy bit line formed in the dummy cell array region instead of the common source line is used as a bulk bias line.

Figure 34A:
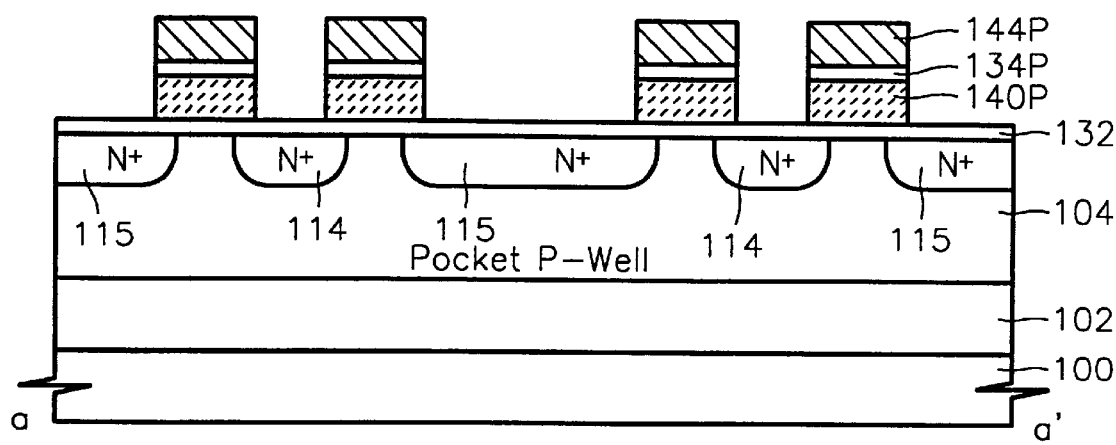
FIGS. 34A through 35C are cross-sectional views illustrating a method of fabricating a non-volatile memory device according to a fourth embodiment of the present invention.
Figure 34B:
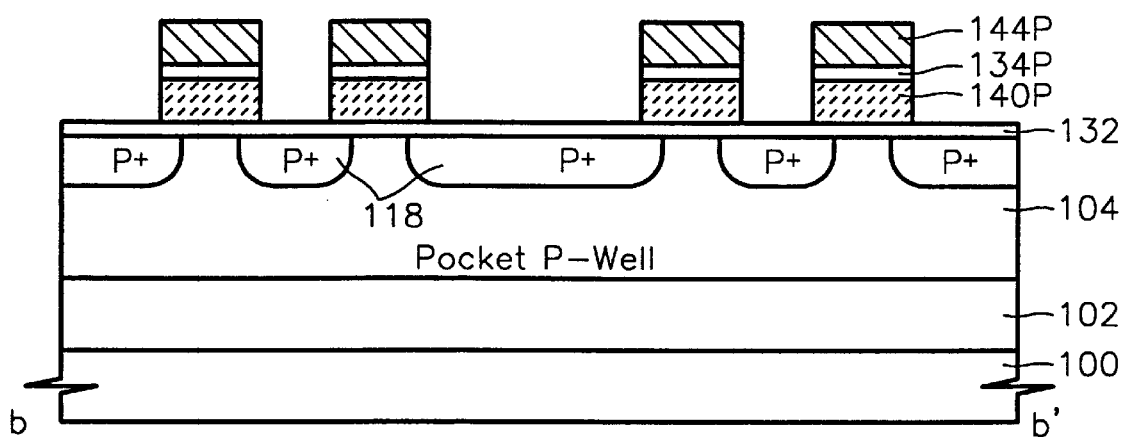
Figure 34C:
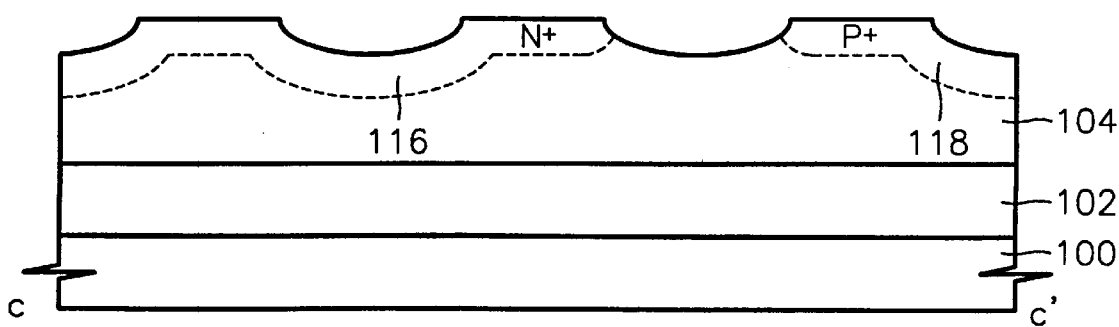
Figure 35A:
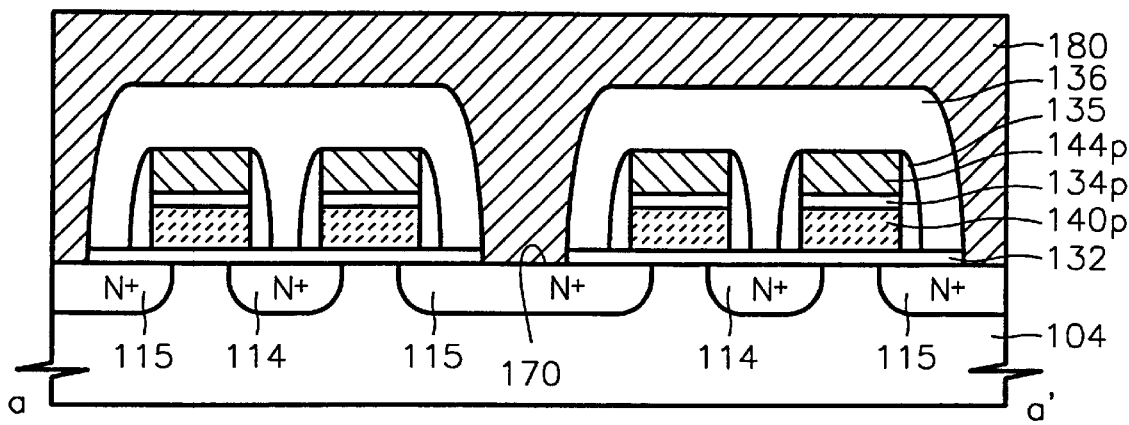
Figure 35B:
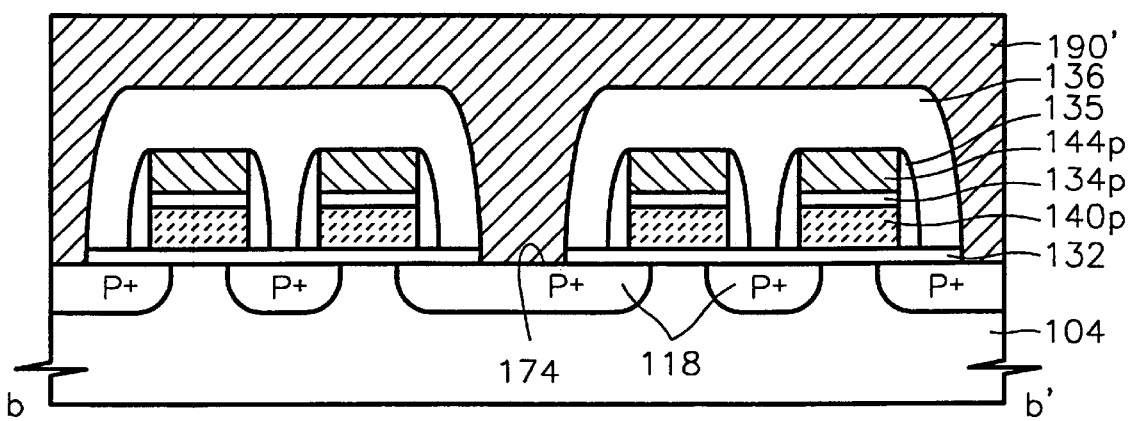
Figure 35C:
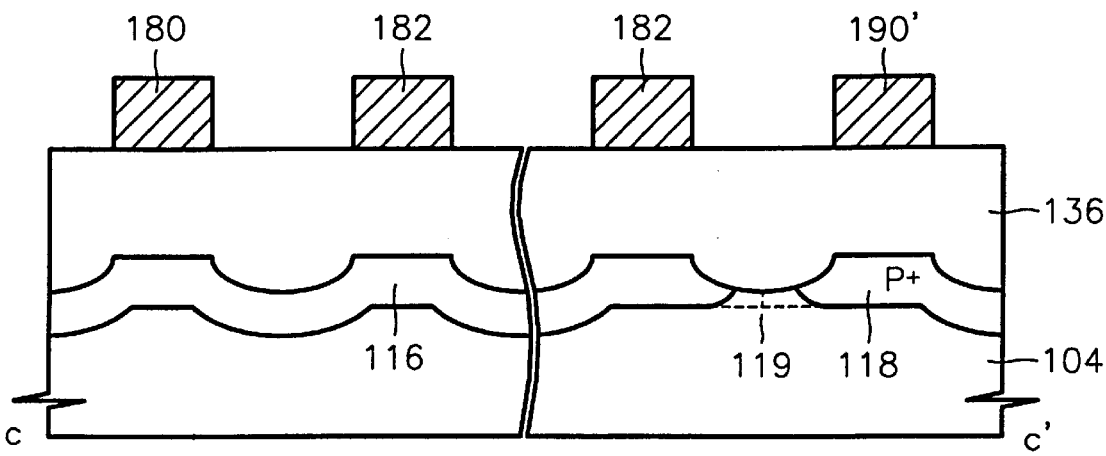

This embodiment will now be described with reference to FIGS. 34A through 35C. FIGS. 34A and 35A are cross-sectional views taken along line a–a' of FIG. 18, FIGS. 34B and 35B are cross-sectional views taken along line b–b' of FIG. 18, and FIGS. 34C and 35C are cross-sectional views taken along line c–c' of FIG. 18.

Specifically, wells 102 and 104 are formed on a semiconductor substrate 100, to define a bulk region to be a cell array region and a bulk region to be a peripheral circuit region. Also, isolation layers are formed to define an active region in which memory cells are to be formed and an active region in which dummy cells are to be formed. Then, a tunneling dielectric layer 132 and a stacked gate of a floating gate 140P, an intergate dielectric layer 134P and a control gate 144P are formed. The control gate 144P, that is, an isolation layer between source regions which are adjacent in the lengthwise direction of a word line, are etched by a self-alignment etching process using the etch mask pattern 204' of FIG. 18 for forming a source line impurity diffusion region. These processes are preformed by the same methods as the method of fabricating non-volatile memory devices according to the first embodiment.

The etch mask pattern 204 (see FIG. 18) for forming a source line impurity diffusion region according to this method is different from the pattern 204 (see FIG. 9) in the method for fabricating a non-volatile memory device according to the first embodiment, in that it defines only a region in which an impurity diffusion region is to be formed and does not define a region in which a bulk bias junction is to be formed.

Thereafter, an ion implantation mask pattern (not shown) is formed on the substrate 100 using the ion implantation mask pattern 150' (see FIG. 18) for forming a source region, a drain region and a source line impurity diffusion region. The ion implantation mask pattern covers only a region in which a bulk bias junction is to be formed, in the dummy cell array region, and exposes the remaining dummy cell array region and the memory cell array region. Then, source regions 114, drain regions 115 and source line impurity diffusion regions 116 are formed by implanting N-type impurity ions using the ion implantation mask pattern as a mask.

Next, an etching process for forming a stacked gate is performed, and thermal processing such as annealing is performed to repair the tunneling dielectric layer 132 damaged upon the ion implantation and to diffuse the implanted N-type impurities to a desired depth so that the impurities are appropriately overlapped by the edge of the stacked gate. In some circumstances, the thermal processing may be omitted.

Then, an ion implantation mask pattern (not shown) is formed on the substrate using the ion implantation mask pattern 160' (see FIG. 18) for forming a bulk bias contact junction. The ion implantation mask pattern can also be used to define the P⁺ junction of a peripheral circuit portion. Next, P-type impurities, for example, boron difluoride, are ion-implanted using the ion implantation mask pattern, thereby forming a bulk bias junction 118 in the drain and source regions in the dummy cell region, as shown in FIG. 33B. Undoubtedly, the bulk bias junction 118 can be formed only in the drain region or only in the source region in the dummy cell array region.

Preferably, the ion implantation mask pattern 160' of FIG. 18 which defines the bulk bias junction is spaced a predetermined distance apart from the ion implantation mask pattern 150' of FIG. 18 which defines the source and drain regions and the source line impurity diffusion regions, such that the source line impurity diffusion region 116 is separated from the bulk bias junction 1 18 as shown in FIG. 34C.

Thereafter, as shown in FIGS. 35A through 35C, an interlayer dielectric 136 is formed. Next, a bit line contact hole 170, a dummy bit line contact hole 172 of FIG. 18, and a bulk bias line contact hole 174 are formed therein by photolithography, and a bit line 180, a dummy bit line 182, and a dummy bit line 190' which acts as a bulk bias line are formed by depositing and patterning a conductive layer. These processes are performed substantially using the same method as the method for fabricating a non-volatile memory device according to the first embodiment, except for the difference in the shapes of patterns that are used.

In the non-volatile memory device according to the present invention, a bulk bias contact structure is included in a cell array portion. Thus, the voltage of a bulk region in which a cell array region is formed can be maintained uniformly and accurately at or below a predetermined voltage regardless of the position of memory cells.

When a bulk bias junction is formed in a semiconductor substrate exposed by removing an isolation layer, and a common source line is used as a bulk bias line which is connected to a bulk contact junction, a bulk bias line does not need to be separately formed within the cell array region upon layout.

When a source line formed of metal is provided, device characteristics can be maintained even if a smaller number of common source lines than those in the prior art are formed. Thus, the bulk bias lines can be arranged at the positions of conventional common source lines.

In addition, a dummy cell array region to be formed to reduce the loading effect can be used as a region for forming a bulk bias contact structure.

That is, the non-volatile memory device according to the present invention can significantly reduce the distance between a cell and a bulk bias contact without increasing the area of a memory cell array. Hence, the voltage of a bulk in which memory cells are formed can be effectively maintained at or below a predetermined voltage.

A bulk bias contact, which is necessary in a peripheral circuit region, is also formed at a region exposed by removing an isolation layer, so that an active region for forming a bulk bias contact is not required in contrast to a conventional method in which a bulk bias contact is formed on an active region. Thus, the layout area of a chip is reduced.

In particular, according to the present invention, even if the layout of chips is changed due to errors generated in association with the bulk bias contact, only a process for removing the isolation layer after a word line is formed needs to be performed to re-manufacture the chips. Thus, there is no need to perform processes from the first process, that is, a process of defining an active region in which the bulk bias contact is to be formed, by forming the isolation layer. Hence, the process verification time is shortened. Accordingly, the period of time for development is also shortened.

What is claimed is:

1. A non-volatile memory device, comprising:
   a cell array region formed on a semiconductor substrate, the cell array region having a plurality of parallel bit lines, a plurality of parallel word lines, a plurality of memory cells, and a plurality of common source lines, the plurality of bit lines being orthogonal to the plurality of word lines, each of the memory cells being connected to a bit line and a word line and having a stacked gate structure comprised of a floating gate and a control gate, and a source/drain region, the plurality of common source lines being parallel to the plurality of bit lines;
   a peripheral circuit region for driving the memory cells in the cell array region; and
   one or more first bulk bias contact structures included in the cell array region for maintaining the voltage of a bulk region in which the cell array region is formed, at or below a predetermined voltage.

2. The non-volatile memory device of claim 1, further comprising one or more second bulk bias contact structures formed on a region of the semiconductor substrate exposed by removing an isolation layer from a predetermined place of the peripheral circuit region, for applying and receiving an electrical signal to and from the peripheral circuit region.

3. A non-volatile memory device, comprising:
   a cell array region having a plurality of parallel bit lines, a plurality of parallel word lines, a plurality of memory cells, and a plurality of common source lines, the plurality of bit lines being orthogonal to the plurality of word lines, each of the memory cells being connected to a bit line and a word line and having a stacked gate comprised of a floating gate and a control gate and a source/drain region, the plurality of common source lines being parallel to the plurality of bit lines; and
   a peripheral circuit region for driving the memory cells in the cell array region,
   wherein the cell array region includes one or more bulk bias contact structures for maintaining the voltage of a bulk region in which the cell array region is formed, at or below a predetermined voltage, and
   wherein the common source lines are connected to the one or more bulk bias contact structures and thus act as bulk bias lines.

4. The non-volatile memory device of claim 3, wherein the one or more bulk bias contact structure are formed on a region of a semiconductor substrate exposed by removing an isolation layer from a predetermined place of the cell array region.

5. The non-volatile memory device of claim 3, wherein the bulk bias contact structure contacts a bulk bias junction doped with impurities having the same conductivity type as the conductivity type of the bulk region in which the cell array region is formed.

6. The non-volatile memory device of claim 3, wherein the common source lines are connected to impurity diffusion regions that are formed on the semiconductor substrate exposed by removing isolation layers between the source regions of the plurality of memory cells that are adjacent to each other in the direction of the word lines, interconnecting the source regions.

7. The non-volatile memory device of claim 3, wherein the common source lines are connected to conductive layer patterns that are formed over isolation layers between the source regions of the plurality of memory cells that are adjacent to each other in the direction of the word lines, interconnecting the source regions.

8. A non-volatile memory device, comprising:
a cell array region having a plurality of parallel bit lines, a plurality of parallel word lines, a plurality of memory cells, and a plurality of common source lines, the plurality of bit lines being orthogonal to the plurality of word lines, each of the memory cells being connected to a bit line and a word line and having a stacked gate comprised of a floating gate and a control gate and a source/drain region, the plurality of common source lines being parallel to the plurality of bit lines;
a peripheral circuit region for driving the memory cells in the cell array region; and
one or more bulk bias contact structures included in the cell array region for maintaining the voltage of a bulk region in which the cell array region is formed, at or below a predetermined voltage,
wherein the common source lines are connected to source lines which connect the source regions of the plurality of memory cells that are adjacent to each other in the direction of the word lines,
wherein the one or more bulk bias contact structures are connected to a bulk bias line insulated from the source lines, and
wherein the common source lines and the bulk bias lines alternate with each other in the cell array region.

9. The non-volatile memory device of claim 8, wherein the source lines are conductive layer patterns that are formed over isolation layers between the source regions of the plurality of memory cells that are adjacent to each other in the direction of the word lines, for interconnecting the source regions.

10. The non-volatile memory device of claim 9, wherein at least 32n (n≧1 where n is an integer) bit lines are arranged between two adjacent common source lines.

11. The non-volatile memory device of claim 9, wherein at least 16n (n≧1 where n is an integer) bit lines are arranged between a bulk bias line and a common source line.

12. The non-volatile memory device of claim 8, wherein the bulk bias lines and the common source lines are electrically separated from each other outside the cell array region.

13. The non-volatile memory device of claim 12, wherein when the memory cells are programmed, first, second, third and fourth voltages are applied to the word lines, the bit lines, the common source lines, and the bulk bias lines, respectively, and the first voltage is greater than the second voltage, the second voltage is greater than the third voltage, and the third voltage is greater than the fourth voltage.

14. The non-volatile memory device of claim 8, wherein the bulk bias lines and the common source lines are electrically connected to each other outside the cell array region.

15. The non-volatile memory device of claim 14, wherein when the memory cells are programmed, a first voltage is applied to the word lines, a second voltage is applied to the bit lines, and a third voltage is applied to the common source lines and the bulk bias lines, and the first voltage is greater than the second voltage, and the second voltage is greater than the third voltage.

16. The non-volatile memory device of claim 8, wherein first and second interlayer dielectric layers are sequentially formed on the semiconductor substrate,
bit line plugs which contact the drain regions of the memory cells, bulk bias line plugs which contact bulk bias junctions, and the source lines are formed within the first interlayer dielectric layer, and
a common source line via for connecting the source lines to the common source lines, a bit line via for connecting the bit lines to the bit line plugs, and a bulk bias line via for connecting the bulk bias lines to the bulk bias line plugs formed within the second interlayer dielectric layer.

17. A non-volatile memory device, comprising:
a cell array region on a semiconductor substrate, the cell array region having a plurality of parallel bit lines, a plurality of parallel word lines, a plurality of memory cells, and a plurality of common source lines, the plurality of bit lines being orthogonal to the plurality of word lines, each of the memory cells being connected to a bit line and a word line and having a stacked gate comprised of a floating gate and a control gate and a source/drain region, the plurality of common source lines being parallel to the plurality of bit lines;
a peripheral circuit region for driving the memory cells in the cell array region;
dummy cells and one or more dummy bit lines for connecting the dummy cells in the cell array region; and
one or more bulk bias contact structures included in the cell array region for maintaining the voltage of a bulk region in which the cell array region is formed, at or below a predetermined voltage,
wherein the one or more dummy bit lines are connected to the one or more bulk bias contact structures and thus act as a bulk bias line.

18. The non-volatile memory device of claim 17, wherein the bulk bias contact structure contacts a bulk bias junction doped with impurities having the same conductivity type as the conductivity type of the bulk region in which the cell array region is formed, and is formed in the source region, drain region, or both the source and drain regions of the dummy cells.

19. The non-volatile memory device of claim 17, wherein the bulk bias junction is spaced a predetermined distance apart from a plurality of source lines for connecting the source regions of the plurality of memory cells, which are adjacent in the direction of the word lines, and for connecting the remaining dummy cells that are not associated with the bulk bias line.

20. The non-volatile memory device of claim 19, wherein the source lines are comprised of impurity diffusion regions that are formed on a region of the semiconductor substrate exposed by removing isolation layers between the source regions of the plurality of memory cells and the source regions of the dummy cells.

21. The non-volatile memory device of claim 19, wherein the source lines are conductive layer patterns that are formed over isolation layers between the source regions of the plurality of memory cells and those of the dummy cells, the conductive layer patterns interconnecting the source regions.

* * * * *

UNITED STATES PATENT AND TRADEMARK OFFICE
CERTIFICATE OF CORRECTION

PATENT NO. : 6,483,749 B1  
DATED : November 19, 2002  
INVENTOR(S) : Choi et al.

Page 1 of 1

It is certified that error appears in the above-identified patent and that said Letters Patent is hereby corrected as shown below:

Column 1,
Line 64, "(CDxVD)+(CIPO+CD+CB+CS)" should read
-- (CDxVD)(CIPO+CD+CB+CS) --;

Column 2,
Line 27, "IBULK" should read -- IBULK --;

Column 3,
Line 17, "which an" should read -- which can --;

Column 6,
Line 15, "The ell array" should read -- The cell array --;

Column 7, line 53 through Column 8, line 8,
Delete paragraph starting with "As shown in FIG. 7…" and ending with "…integration of semiconductor devices.";

Coumn 14,
Line 57, "mask pattern 203" should read -- mask pattern 203' --;

Column 19,
Line 19, "junction 1 18" should read -- junction 118 --.

Signed and Sealed this

Twentieth Day of May, 2003

JAMES E. ROGAN
*Director of the United States Patent and Trademark Office*